US008581190B2

(12) United States Patent
Nakano et al.

(10) Patent No.: US 8,581,190 B2
(45) Date of Patent: Nov. 12, 2013

(54) CHARGED PARTICLE BEAM APPARATUS AND GEOMETRICAL ABERRATION MEASUREMENT METHOD THEREFOR

(75) Inventors: Tomonori Nakano, Kodaira (JP); Takeshi Kawasaki, Musashino (JP); Kotoko Hirose, Matsudo (JP); Hiroyuki Ito, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/058,540

(22) PCT Filed: Aug. 5, 2009

(86) PCT No.: PCT/JP2009/003751
§ 371 (c)(1),
(2), (4) Date: Feb. 11, 2011

(87) PCT Pub. No.: WO2010/035386
PCT Pub. Date: Apr. 1, 2010

(65) Prior Publication Data
US 2011/0139980 A1 Jun. 16, 2011

(30) Foreign Application Priority Data
Sep. 25, 2008 (JP) ................................. 2008-246514

(51) Int. Cl.
*G01N 23/225* (2006.01)
(52) U.S. Cl.
USPC ............................ 250/310; 250/307; 250/311
(58) Field of Classification Search
USPC ........ 250/306–307, 310–311, 492.22–492.23
See application file for complete search history.

(56) References Cited

U.S. PATENT DOCUMENTS

| | | | |
|---|---|---|---|
| 6,037,601 A * | 3/2000 | Okunuki | 250/492.23 |
| 6,323,499 B1 * | 11/2001 | Muraki et al. | 250/492.22 |
| 6,724,710 B2 * | 4/2004 | Chung et al. | 369/112.02 |
| 7,109,484 B2 * | 9/2006 | Nakasuji et al. | 250/310 |
| 7,186,975 B2 * | 3/2007 | Ishitani et al. | 250/310 |
| 7,345,735 B2 * | 3/2008 | Smith | 355/52 |
| 7,504,624 B2 * | 3/2009 | Kawasaki et al. | 250/310 |
| 8,026,491 B2 * | 9/2011 | Ogashiwa et al. | 250/307 |
| 2005/0156117 A1 | 7/2005 | Uno | |

(Continued)

FOREIGN PATENT DOCUMENTS

| | | |
|---|---|---|
| JP | 10-294255 A | 11/1998 |
| JP | 2005-183085 A | 7/2005 |

(Continued)

OTHER PUBLICATIONS

J. Zach et al., Aberration correction in low voltage SEM by a multipole corrector, Nuclear Instruments and Methods in Physics Research, A363, pp. 316-325, 1995.

*Primary Examiner* — David A Vanore
*Assistant Examiner* — Wyatt Stoffa
(74) *Attorney, Agent, or Firm* — Mattingly & Malur, PC

(57) ABSTRACT

Disclosed is a scanning charged particle microscope provided with an aberration measuring means that measures high-order geometrical aberration at high precision and high speed. An image obtained by a single-hole aperture and an image obtained by a multiple-hole aperture arranged in a region larger than that for the single-hole aperture are deconvoluted, an aberration quantity is determined based on the profiles of beams tilted in a plurality of directions and the obtained quantity is fed back to an aberration corrector.

19 Claims, 21 Drawing Sheets

(56) References Cited

U.S. PATENT DOCUMENTS

| | | |
|---|---|---|
| 2005/0247884 A1* | 11/2005 | Nakamura et al. ........ 250/396 R |
| 2006/0255269 A1* | 11/2006 | Kawasaki et al. ............. 250/310 |
| 2007/0138388 A1* | 6/2007 | Ward et al. .................... 250/288 |
| 2007/0221860 A1* | 9/2007 | Kawasaki et al. ............. 250/398 |
| 2007/0284536 A1* | 12/2007 | Frosien .................... 250/396 R |
| 2008/0230711 A1* | 9/2008 | Platzgummer et al. ... 250/396 R |
| 2009/0008550 A1 | 1/2009 | Nakano et al. |
| 2009/0058979 A1* | 3/2009 | Saisho et al. ................... 347/232 |
| 2009/0184243 A1* | 7/2009 | Kawasaki et al. ............. 250/310 |
| 2009/0212228 A1 | 8/2009 | Hirose et al. |
| 2009/0218506 A1* | 9/2009 | Nakasuji et al. ....... 250/396 ML |
| 2010/0033560 A1 | 2/2010 | Kawasaki et al. |
| 2010/0227200 A1* | 9/2010 | Miyata et al. ................. 250/306 |
| 2010/0264309 A1 | 10/2010 | Hirose et al. |
| 2011/0139980 A1* | 6/2011 | Nakano et al. ................. 250/307 |
| 2011/0253893 A1* | 10/2011 | Banzhof ....................... 250/307 |

FOREIGN PATENT DOCUMENTS

| | | |
|---|---|---|
| JP | 2005-302359 A | 10/2005 |
| JP | 2005-310699 A | 11/2005 |
| JP | 2006-147381 A | 6/2006 |
| JP | 2006-318774 A | 11/2006 |
| JP | 2008-159286 A | 7/2008 |
| JP | 2008-288024 A | 11/2008 |
| JP | 2009-199904 A | 9/2009 |
| JP | 2010-40381 A | 2/2010 |
| WO | 2010/082489 A1 | 7/2010 |

* cited by examiner

α: CONVERGENCE ANGLE (a)　　　　　　　(b)

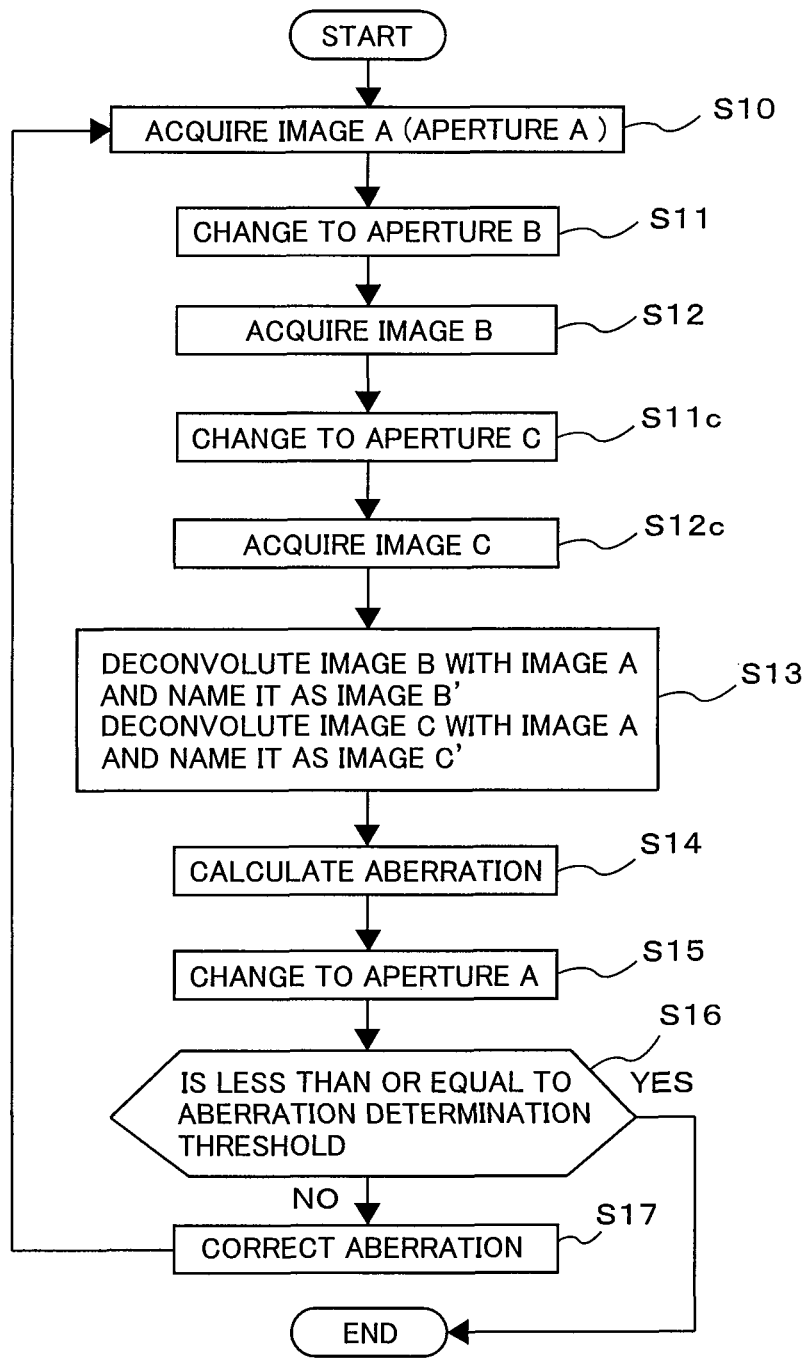

FIG. 4
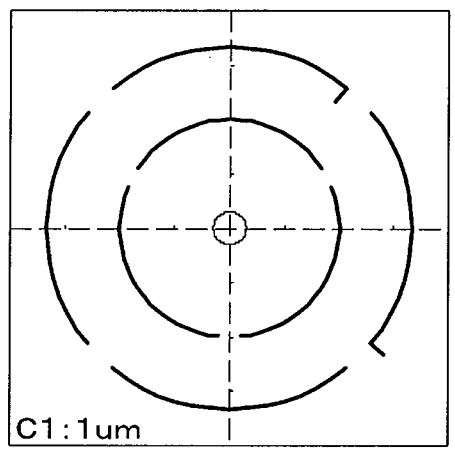
(a)
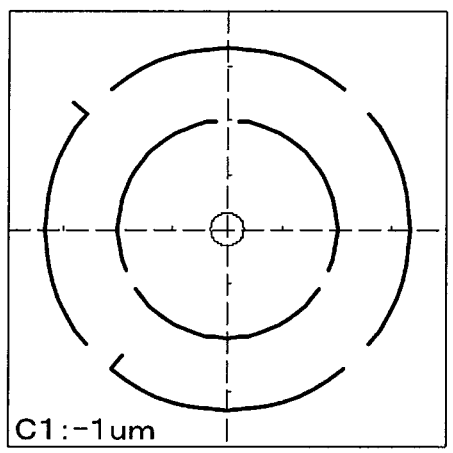
(b)
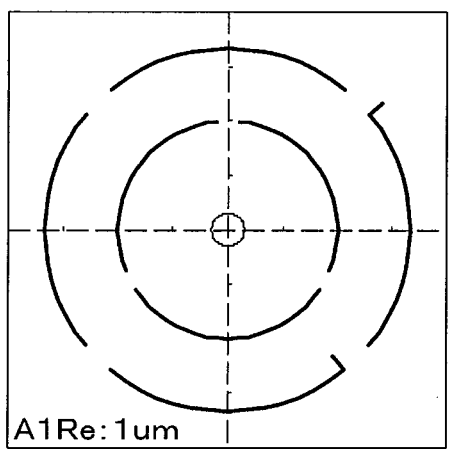
(c)
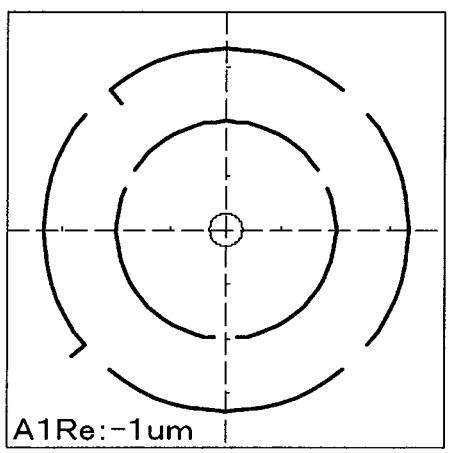
(d)
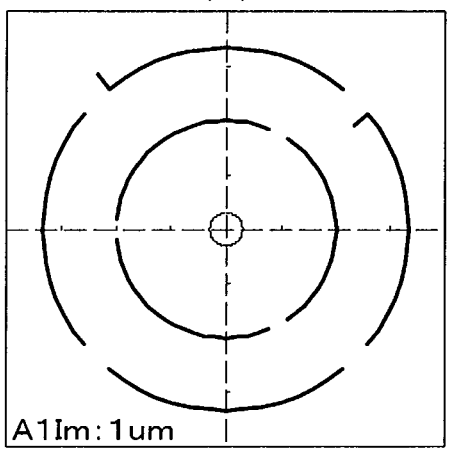
(e)
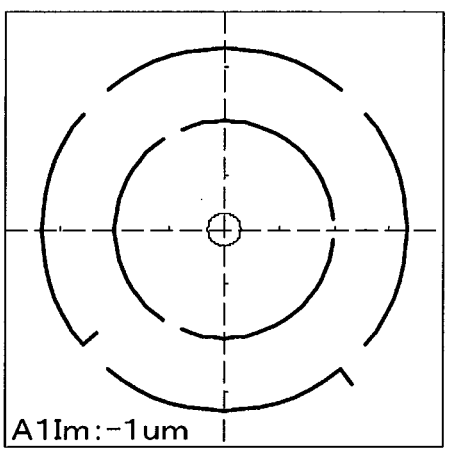
(f)

FIG. 5
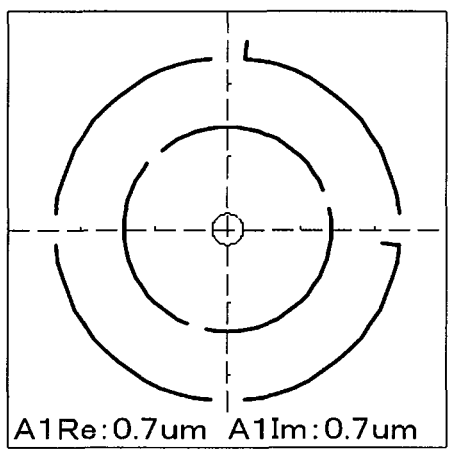
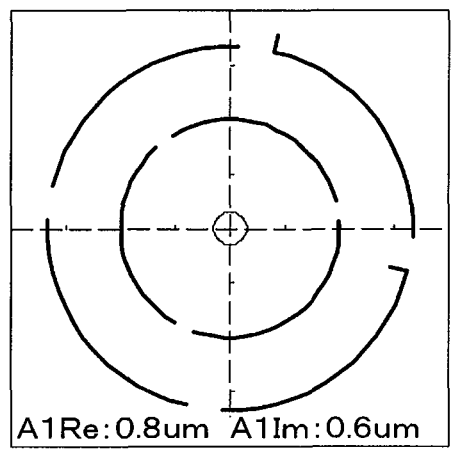
(a)           (b)
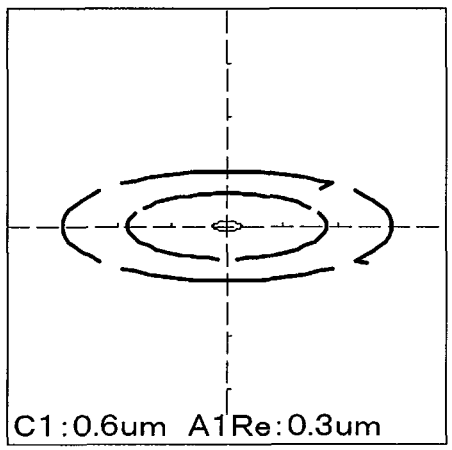
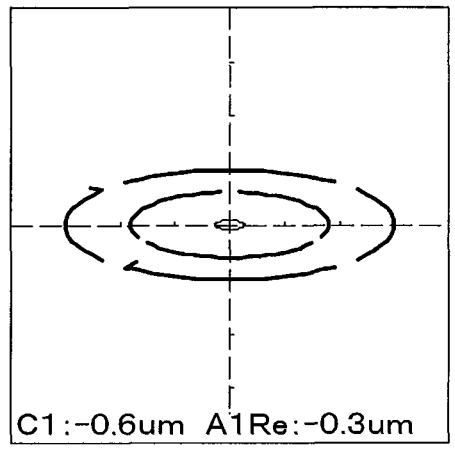
(c)           (d)

FIG. 6A
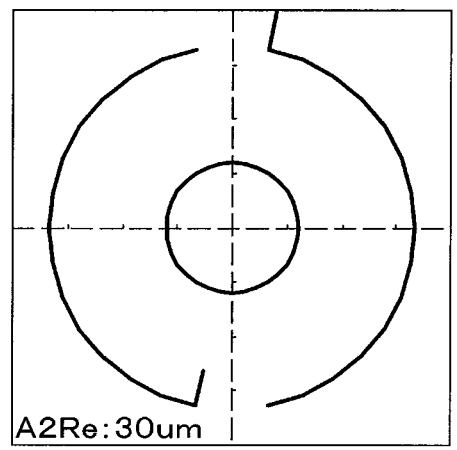
(a)
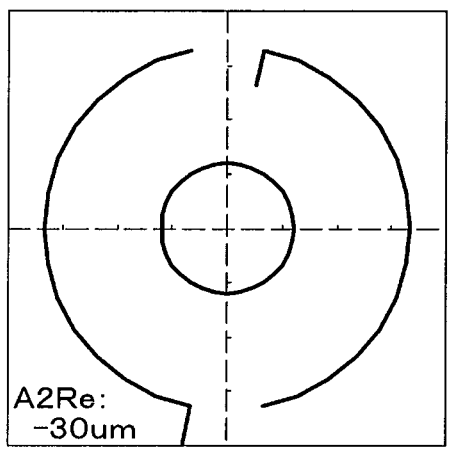
(b)
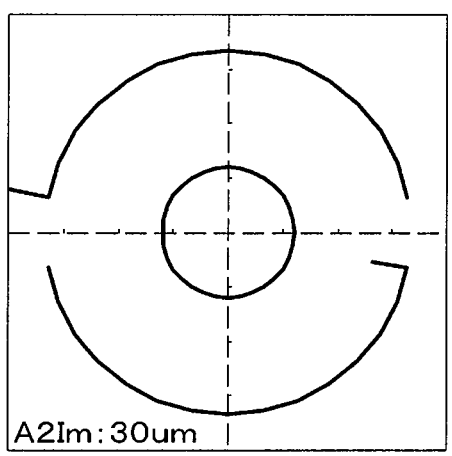
(c)
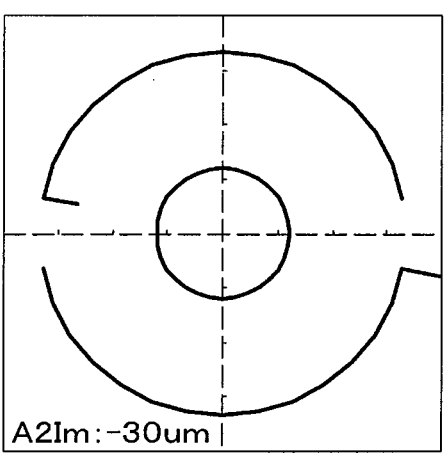
(d)
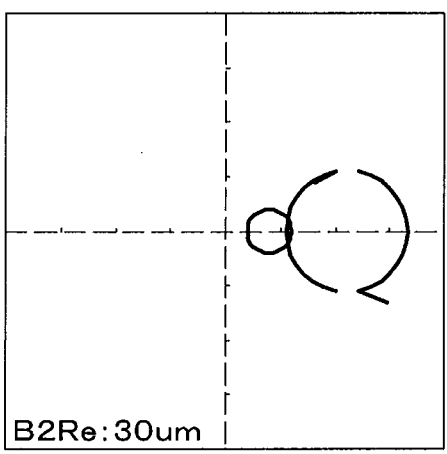
(e)
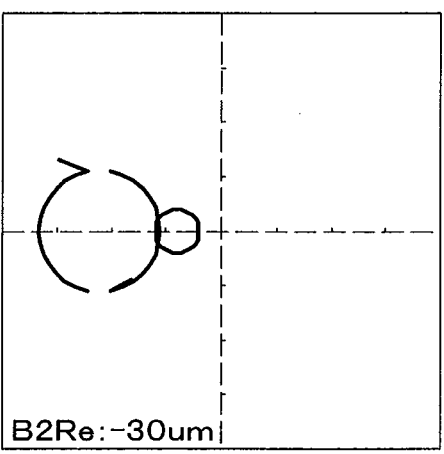
(f)

FIG. 6B
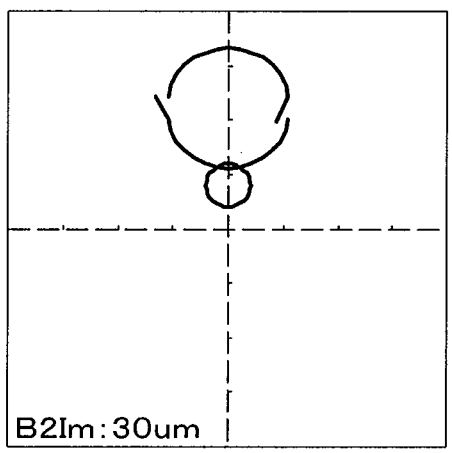 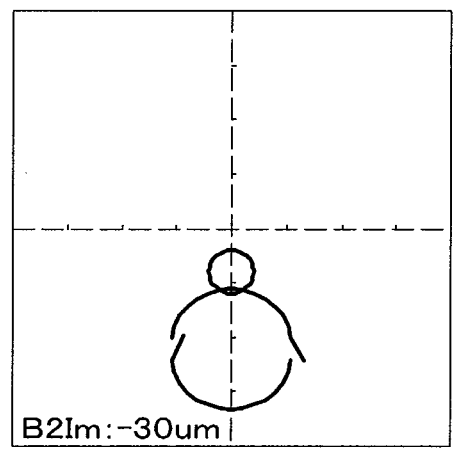
(g)  (h)

FIG. 7B
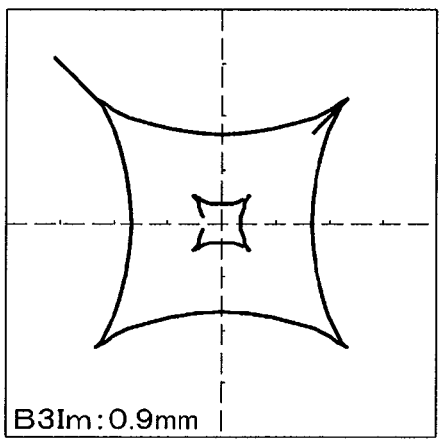
(g)
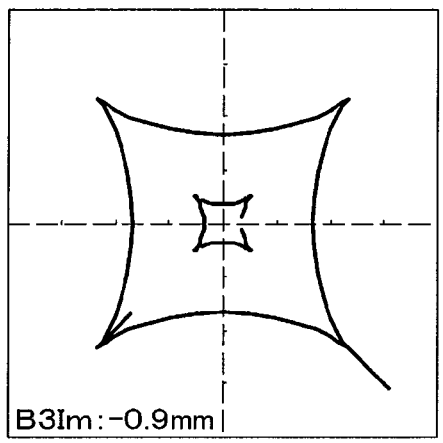
(h)
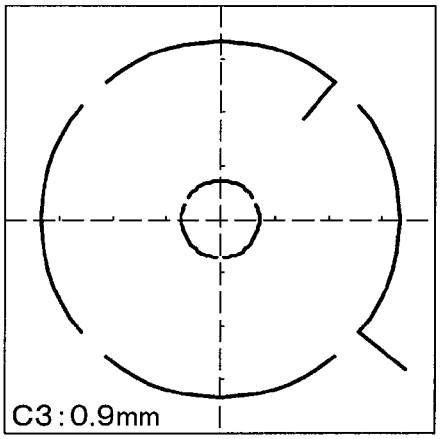
(i)
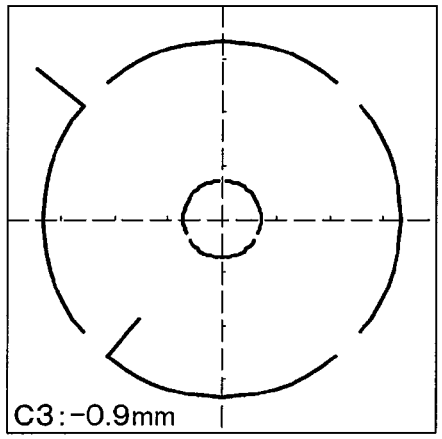
(j)

FIG. 8A
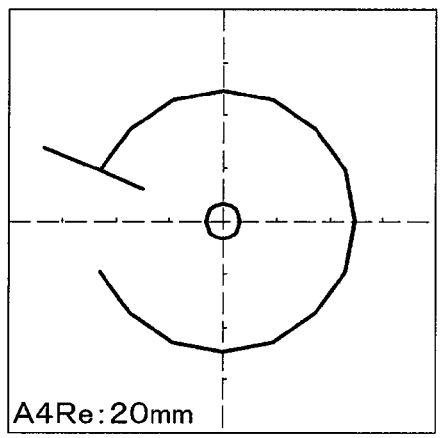
A4Re:20mm
(a)
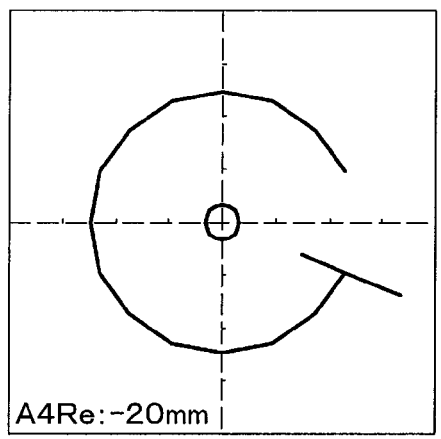
A4Re:-20mm
(b)
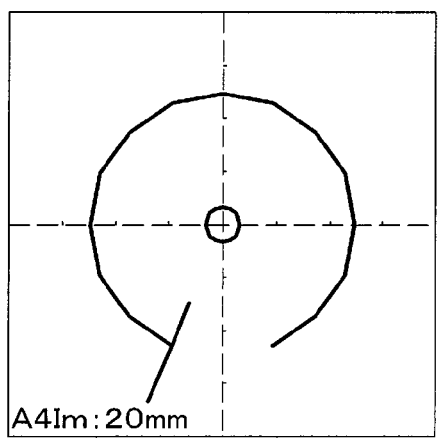
A4Im:20mm
(c)
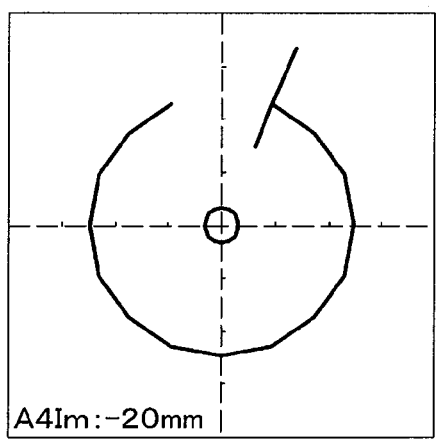
A4Im:-20mm
(d)
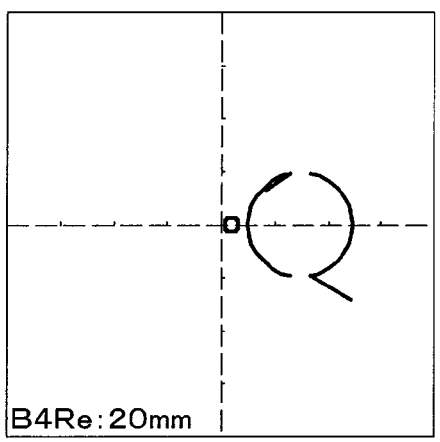
B4Re:20mm
(e)
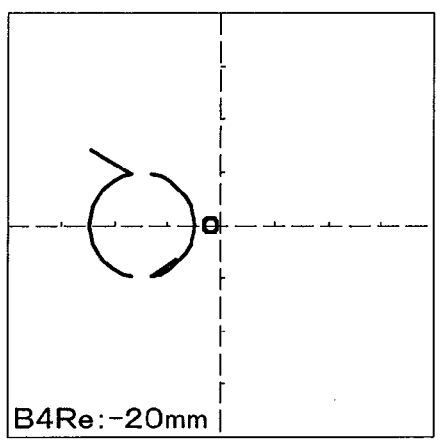
B4Re:-20mm
(f)

FIG. 8B
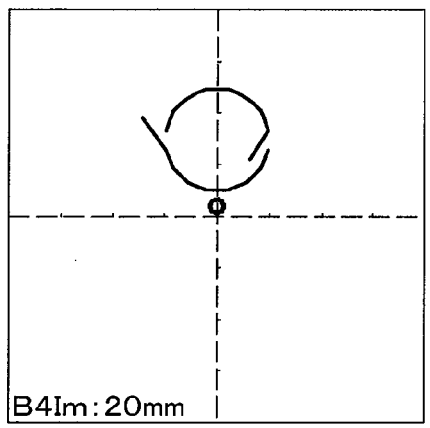
(g)
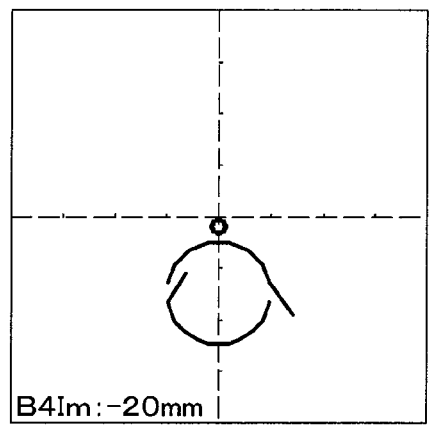
(h)
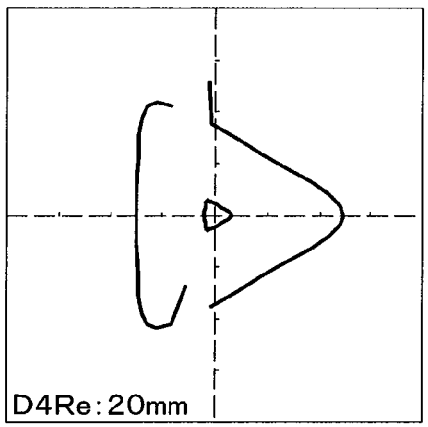
(i)
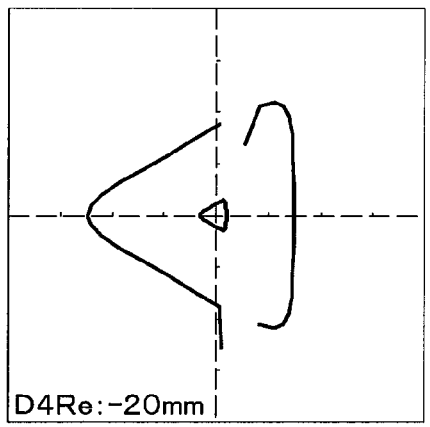
(j)
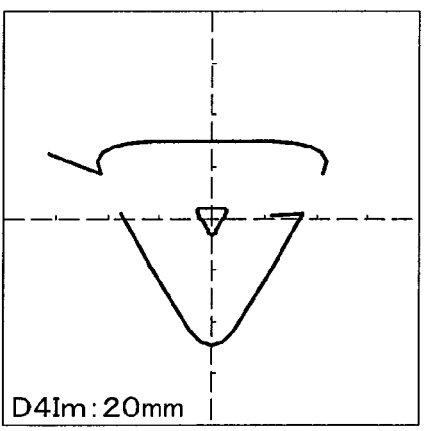
(k)
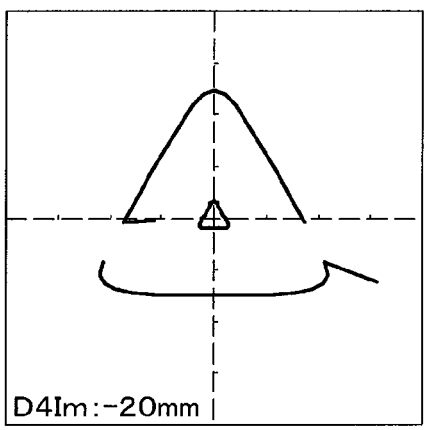
(l)

FIG. 9A
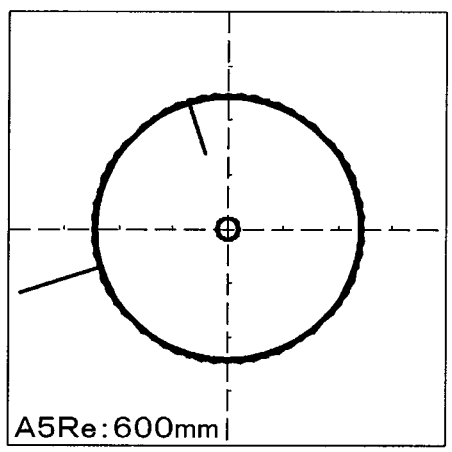
(a)
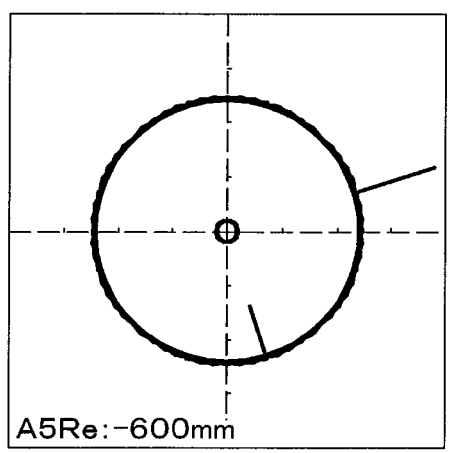
(b)
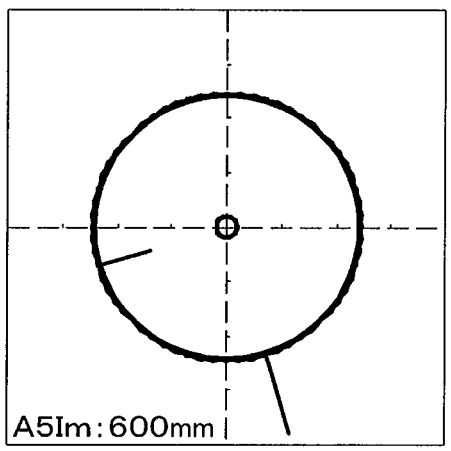
(c)
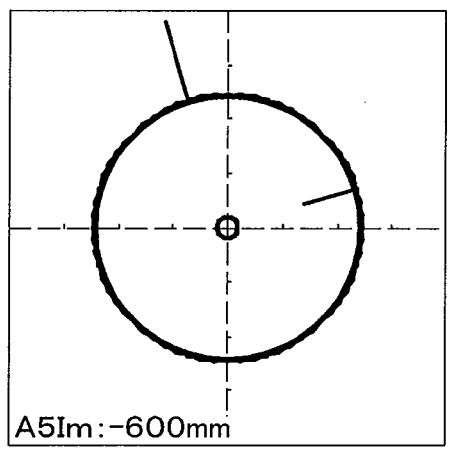
(d)
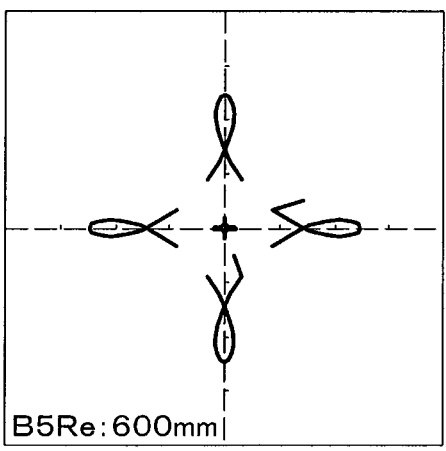
(e)
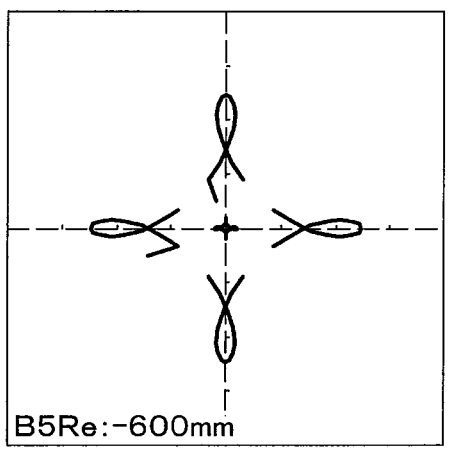
(f)

(m)　　　　　　　　　　(n)

FIG. 13
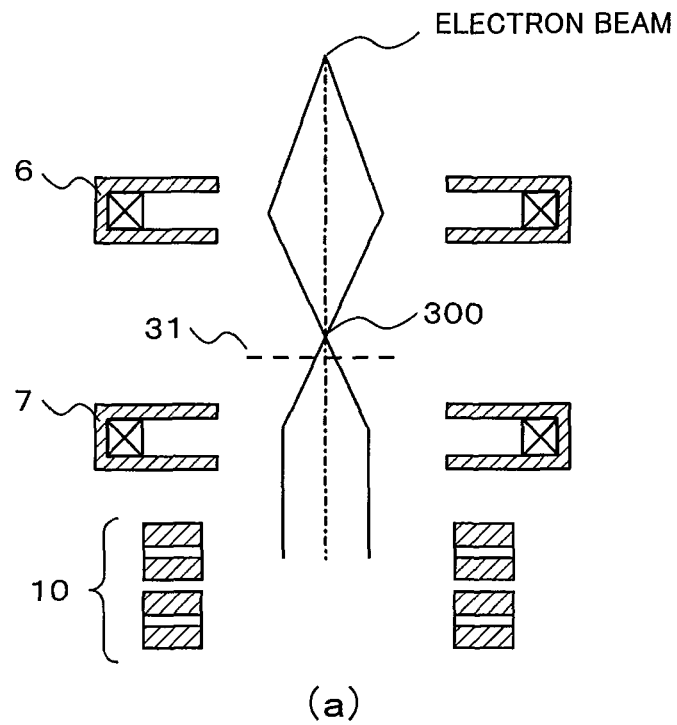
(a)
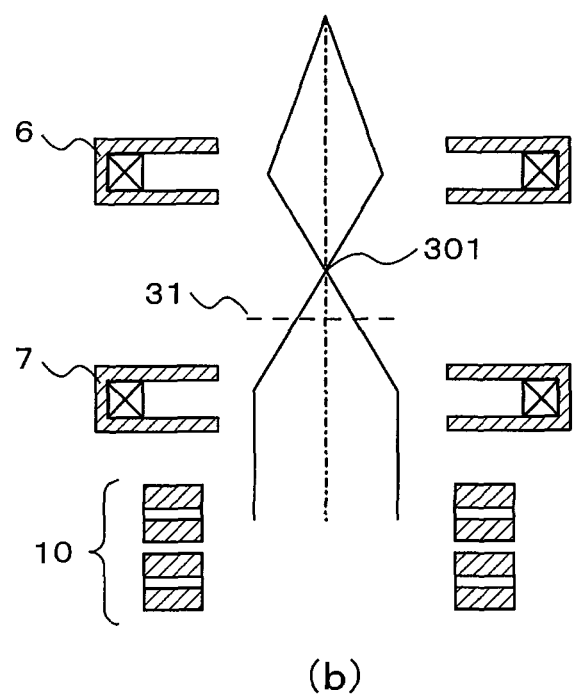
(b)

CHARGED PARTICLE BEAM APPARATUS AND GEOMETRICAL ABERRATION MEASUREMENT METHOD THEREFOR

TECHNICAL FIELD

The present invention relates to a charged particle beam apparatus that irradiates a charged particle beam onto a specimen by scanning and acquires secondary electrons or reflected electrons from this specimen, and a method for measuring its geometrical aberrations.

BACKGROUND ART

In charged particle beam apparatuses including electron microscopes, such as a scanning electron microscope (SEM) and a transmission electron microscope (TEM), lenses using an electric field or magnetic field are necessarily used in order to focus the charged particle beam. In the electric field or magnetic field lens, various aberrations occur inevitably. Therefore, even if the charged particle beam is intended to be narrowed by increasing a reduction ratio, a spot diameter cannot be made small because of large aberrations; therefore, improvement in observation of a fine structure and in dimensional measurement accuracy or precision cannot be performed.

In the charged particle beam apparatus, in order to improve resolution, introduction of an aberration corrector is being advanced. This aberration corrector usually includes multipole lenses installed in a plurality of stages, and removes aberrations included in the charged particle beam passing through their insides by generating electric fields or magnetic fields in the multipole lenses.

Regarding this aberration corrector, for example, one that uses four stages of the multipole lenses is disclosed in the following Non-patent document 1.

Moreover, as a technology of detecting geometrical aberrations of the charged particle beam apparatus and correcting them, for example, there is a deconvolution technology disclosed in the following Patent document 1. This technology acquires beam profile data by acquiring a just-focused image and a plurality of defocused images, performing Fourier transformation on each of the pieces of image data, dividing the defocused image data being Fourier transformed by the just-focused image data being Fourier transformed, and performing inverse Fourier transformation on this value. Then, various kinds of geometrical aberrations are found based on this beam profile data, and the various kinds of aberrations are removed by making the aberration corrector operate according to respective aberration quantities.

In the following Patent document 2, a technology of measuring aberrations is disclosed where, by controlling an aperture angle of incidence of the charged particle beam to a specimen, the geometrical aberrations of the second-order or higher are actualized.

The following Patent document 3 discloses a technology where the aperture has a plurality of openings as means for dividing an optical path of the primary charged particle beam into a plurality of optical paths, and chromatic aberration and the geometrical aberrations are corrected. The plurality of openings have a first opening placed on an optical-axis of the primary charged particle beam and a plurality of openings placed on one circumference centered on this first opening in an annular shape.

PRIOR ART DOCUMENTS

Patent Document

[Patent document 1] Japanese Patent Application Laid-open Publication No. 2005-183085
[Patent document 2] Japanese Patent Application Laid-Open Publication No. 2006-147381
[Patent document 3] Japanese Patent Application Laid-Open Publication No. 2006-318774

Non-Patent Document

[Non-Patent document 1] Nuclear Instruments and Methods in Physics Research, A363 (1995), pp. 316-325

SUMMARY OF THE INVENTION

Problem to be Solved by the Invention

However, Patent document 1 discloses only an aberration measurement method for up to the third-order as a method for finding geometrical aberrations, and does not disclose a higher-order aberration measurement method. Moreover, in the case where, when being less than or equal to the third-order, a plurality of geometrical aberrations exist mixedly with relatively the same quantity, since it is difficult for this method to separate the aberrations between different orders, it is considered that the correction is performed based on an erroneous measurement, the number of iteration of an aberration measurement and a correction will increase, and aberration correction will take time.

With the technology disclosed in Patent document 2, a problem that a measurement of the actualized geometrical aberration must be done for each order and a precise measurement increases a time is considered.

With the technology disclosed in Patent document 3, aberrations are determined from appearance of the image. That is, a user adjusts an aberration corrector so that rings may overlap each other while checking the SEM image by visual inspection. Therefore, there are considered problems that the plurality of geometrical aberrations cannot be separated accurately and therefore it is not applicable to specimens except a specimen with a single structure, and the like.

Focusing on the conventional problems like this, the present invention has an object to provide a charged particle beam apparatus capable of shortening a time taken for a measurement of high-order geometrical aberrations without deteriorating accuracy or precision.

Means for Solving the Problem

If typical aspects of the invention disclosed in this application are explained briefly, they will be as described below. That is, a charged particle beam apparatus, comprising:
a specimen stage on which a specimen is mounted;
an irradiation optical system for scanning a primary charged particle beam on the specimen mounted on the specimen stage;
a detector for detecting secondary charged particles generated by the scanning of the charged particle beam;
display means for displaying an output signal of the detector as an image; and
an arithmetic unit for detecting aberrations;

wherein the irradiation optical system comprises:

an aberration corrector for correcting the aberrations of the primary charged particle beam emitted from a charged particle beam source; and an aperture for aberration measurement placed between the charged particle beam source and the aberration corrector, wherein the aperture for aberration measurement comprises:

a first aperture part equipped with a central opening placed on an optical-axis of primary charged particles emitted from the charged particle beam source; and a second aperture part having a plurality of openings placed on a plurality of concentric circles with different radii on the central opening and its outside each in an annular shape centered on the optical-axis, wherein the arithmetic unit is equipped with a function of acquiring a first image acquired by the charged particle beam having passed through only the opening of the first aperture part, and a second image acquired in the same scanning region as that of the first image by the charged particle beam having passed through the plurality of openings of the second aperture part, and a function of measuring the aberrations from the first image and the second image.

Effect of the Invention

According to the present invention, it is possible to correlatively acquire a plurality of images in a circumferential direction by a multiple-hole aperture having different radii (convergence angles) provided in the aperture for aberration measurement and to extract an aberration of a specific order with an emphasis on it by selecting the multiple-hole apertures for the images of a plurality of convergence angles. Therefore, measurement of a high-order aberration can be performed in a short time without deteriorating accuracy or precision. For this reason, it is possible to lessen damages given to the specimen, to increase a throughput in a semiconductor measuring apparatus, and to reduce a load on an operator in manual correction.

BRIEF DESCRIPTION OF THE DRAWINGS

FIG. 3 is a flowchart of aberration corrector adjustment according to the first embodiment.

FIG. 4 is a diagram showing an example of first-order aberration figures according to the first embodiment.

FIG. 5 is a diagram showing an example of first-order aberration figures that are combined according to the first embodiment.

FIG. 6A is a diagram showing an example of second-order aberration figures according to the first embodiment.

FIG. 6B is a diagram showing an example of second-order aberration figures according to the first embodiment.

FIG. 7B is a diagram showing an example of third-order aberration figures according to the first embodiment.

FIG. 8A is a diagram showing an example of fourth-order aberration figures according to the first embodiment.

FIG. 8B is a diagram showing an example of fourth-order aberration figures according to the first embodiment.

FIG. 9A is a diagram showing an example of fifth-order aberration figures according to the first embodiment.

FIG. 13 is an explanatory diagram of a scanning electron microscope optical system in another embodiment of the present invention.

MODE FOR CARRYING OUT THE INVENTION

According to a typical embodiment of the present invention, in a charged particle optical apparatus equipped with aberration correction means, by using a single-hole aperture and a multiple-hole aperture at the time of a geometrical aberration measurement, two kinds of images are obtained, an image obtained by scanning a specimen with a single beam and overlapping images obtained by scanning it with a plurality of beams for a scanning charged particle beam image (e.g., an SEM image and an STEM image). When the above-mentioned two kinds of images are deconvoluted, a beam profile that is tilted in a plurality of directions can be obtained. It is possible to correct geometrical aberrations of up to high-orders in high speed by determining each aberration quantity from a direction, symmetry, and a shape of that beam profile and relationships of a direction, symmetry, and a shape of the multiple-hole aperture and then by feeding it back for adjustment of the aberration corrector. Hereafter, examples in each of which the present invention is applied to a scanning electron microscope as a mode of the present invention will be explained.

Incidentally, the present invention has a possibility of being used for a scanning electron microscope, a semiconductor inspection apparatus, a scanning transmission electron microscope, a focused ion beam apparatus, etc. That is, basically the same technique as that of this embodiment can be applied to other electron beam apparatuses and other charged particle optical apparatuses such as of protons and ions, although a configuration of lenses and an aberration corrector may be changed depending on its kind. Although the aberration corrector is assumed as one that corrects chromatic aberration and geometrical aberrations of the third-order and lower, in the embodiment, the geometrical aberrations will be described, and aberrations indicate the geometrical aberrations unless otherwise specified.

First Embodiment

Figure 1:
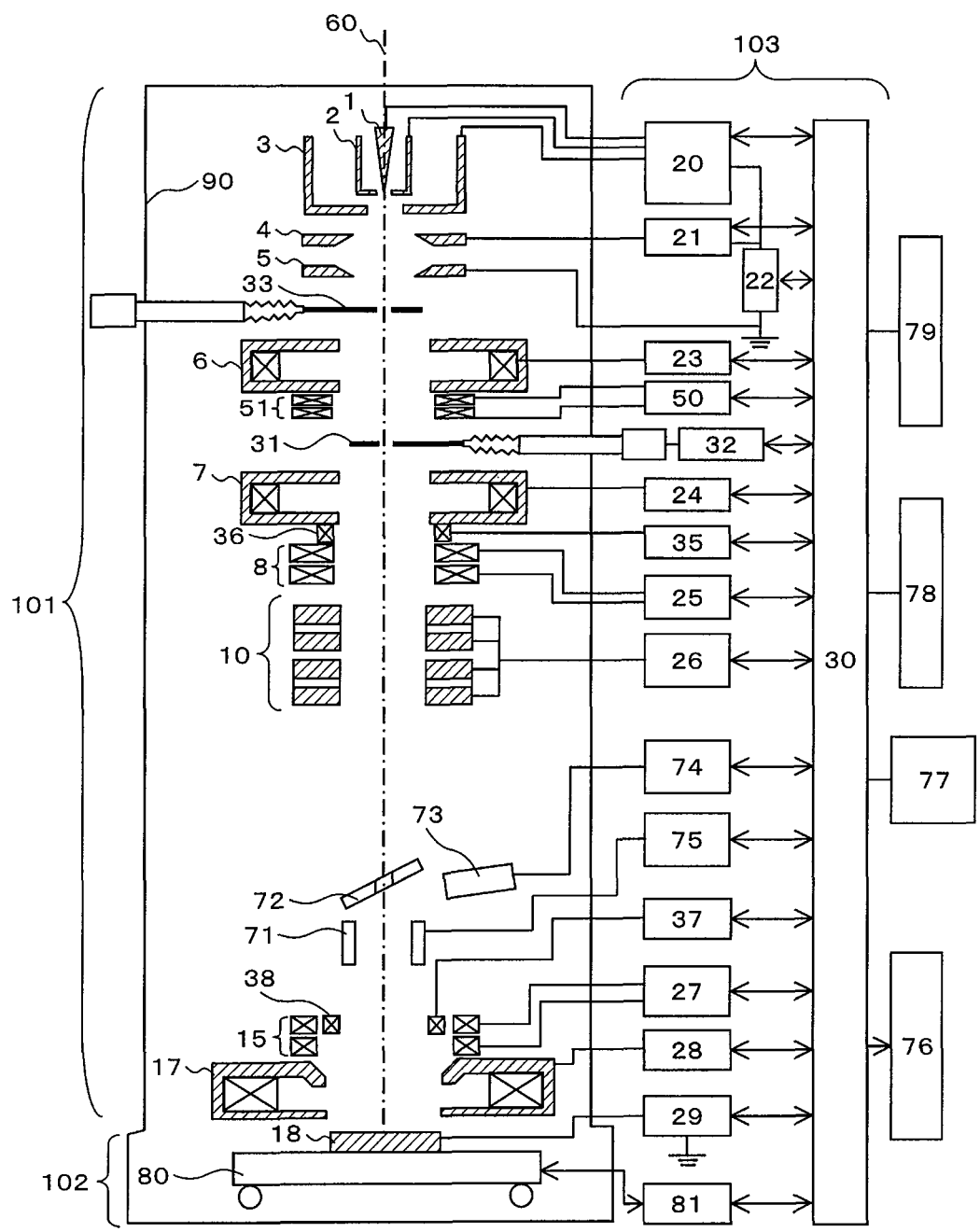
FIG. 1 is an outline block diagram of a scanning electron microscope to which the present invention is applied.

First, a first embodiment of the present invention will be described referring to FIG. 1 to FIG. 9. An outline configuration of a scanning electron microscope based on the first embodiment of the present invention is shown in FIG. 1. The scanning electron microscope of this embodiment roughly includes an SEM column 101 for irradiating or scanning an electron beam onto the specimen, a specimen chamber 102 in which a specimen stage is stored, a control unit 103 for controlling constituent components of the SEM column 101 and the specimen chamber 102, etc. Further, a data storage 76 for storing predetermined information, a monitor 77 for displaying an acquired image, a console 78 for serving as a man-machine interface between the electron microscope and a user, and an aberration arithmetic unit 79 are connected to the control unit 103 equipped with a control computer 30. The console 78 includes, for example, information input means, such as a key board and a mouse. The aberration arithmetic unit 79 has a function of calculating various kinds of aberration quantities by processing a plurality of acquired SEM images with different convergence angles. Incidentally, the aberration arithmetic unit 79 can also be incorporated in the control computer 30 as an aberration operation program.

Next, components inside the SEM column 101 placed in a vacuum vessel 90 will be explained. A Schottky electron source 1 as a charged particle beam source is an electron source such that oxygen, zirconium, etc. are made to diffuse in a single crystal of tungsten, which uses the Schottky effect, and a suppresser electrode 2 and an extraction electrode 3 are provided in its neighborhood. Schottky electrons are made to be emitted by heating the Schottky electron source 1 and impressing a voltage of about +2 kV between the extraction electrodes 3 and it. A negative voltage is impressed to the suppresser electrode 2, and suppresses electron emission from other than a top end of the Schottky electron source 1. An electron beam exiting from a hole of the extraction electrode 3 is accelerated and converged by an electrostatic lens formed with a first anode 4 and a second anode 5, and further the electron beam enters a later stage component along an optical-axis 60. The electron beam is limited in beam current by a movable aperture 33 for beam limitation, is converged by a first condenser lens 6 for controlling an aperture angle and a convergence angle, is limited in beam diameter by a movable aperture 31 for aberration measurement, passes though a second condenser lens 7 and a deflector 8 that adjust the passing electron beam to a specified angle, and enters an aberration corrector 10. The movable aperture 31 for aberration measurement includes a single circular opening in the central part and a multiple-hole aperture on its outer circumferential side, as will be explained in detail. Incidentally, a multiple-hole aperture for aberration measurement may be placed in the later stage of the second condenser lens 7. The deflector 8 is adjusted so that the axis of the condenser lens 7 and the axis of the aberration corrector 10 may coincide with each other. A deflector 51 is adjusted so that the axis of the condenser lens 6 and the axis of the movable aperture 31 may coincide with each other. In this embodiment, the aberration corrector 10 of a quadrupole-octupole system will be explained as an example.

Although a quadrupole and an octupole are formed in respective stages of the aberration corrector 10, if an electrode of a dodecapole (it may work also as a magnetic pole) is used for this, a dipole, a hexapole, and a dodecapole can be formed in addition to the quadrupole and the octupole, and these are used in order to electrically correct a distortion of the field that is produced by an assembly error of the electrode and the magnetic pole and nonuniformity of a magnetic pole material. The electron beam that is given the chromatic aberration and spherical aberration that cancel an objective lens 17 by the aberration corrector 10 is deflected by an objective aligner 38 so as to pass through an objective lens axis, and is converged on a specimen 18 by the objective lens 17, and its spot is made to scan on the specimen by a scanning deflector 15.

A specimen stage 80 having a specimen mounting surface on which the specimen 18 is mounted is stored in the inside of the specimen chamber 102. Secondary electrons generated by electron beam irradiation pass through the objective lens 17, and hit a reflector plate 72 to generate electrons. Although the generated electrons are detected by a secondary-electron detector 73, a position at which the secondary electrons hit on the reflector plate 72 can also be adjusted by an E×B deflector 71. The detected secondary electron signal is taken into the control computer 30 as a luminance signal that synchronizes with the scanning. The control computer 30 performs suitable processing on taken-in luminance signal information, which is displayed as an SEM image on the monitor 77. Although only one detector is illustrated here, a plurality of detectors can also be arranged so that energy and angular distributions of backscattered electrons and secondary electrons may be selected and their images may be acquired. If the secondary electrons are directly gathered in the secondary-electron detector 73 by the E×B deflector 71 or a secondary-electron detector in a concentric circular plate shape having a hole in its center is placed on the optical-axis 60, the reflector plate 72 is not necessarily required.

The control unit 103 includes an electron gun power supply 20, a control voltage source 21, an acceleration voltage source 22, a first condenser lens power supply 23, a second condenser lens power supply 24, a deflection coil power supply 25, an aberration corrector power supply 26, a scanning coil power supply 27, an objective lens power supply 28, a retarding power supply 29, a movable aperture micromotion mechanism 32, an astigmatism correction coil power supply 35, an objective aligner power supply 37, a deflection coil power supply 50, an objective secondary-electron detector power supply 74, an E×B deflector power supply 75, and a specimen stage control mechanism 81, etc. and each of them is connected with a corresponding component in an SEM column through a signal transmission line, electric wiring, etc., respectively.

Figure 2A:
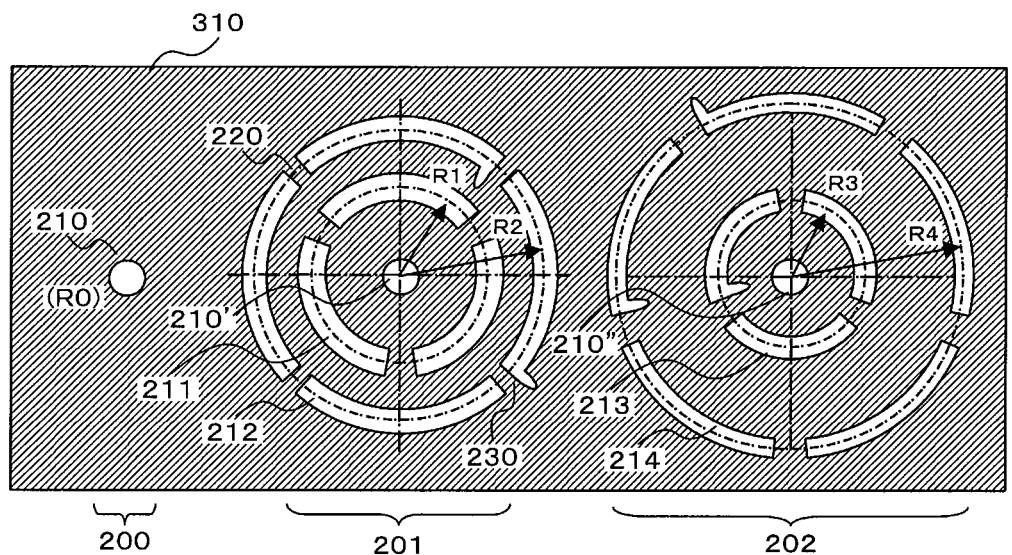
FIG. 2A is a diagram showing an example configuration of a movable aperture that is according to a first embodiment of the present invention and has a single circular opening and a plurality of openings.
Figure 2B:
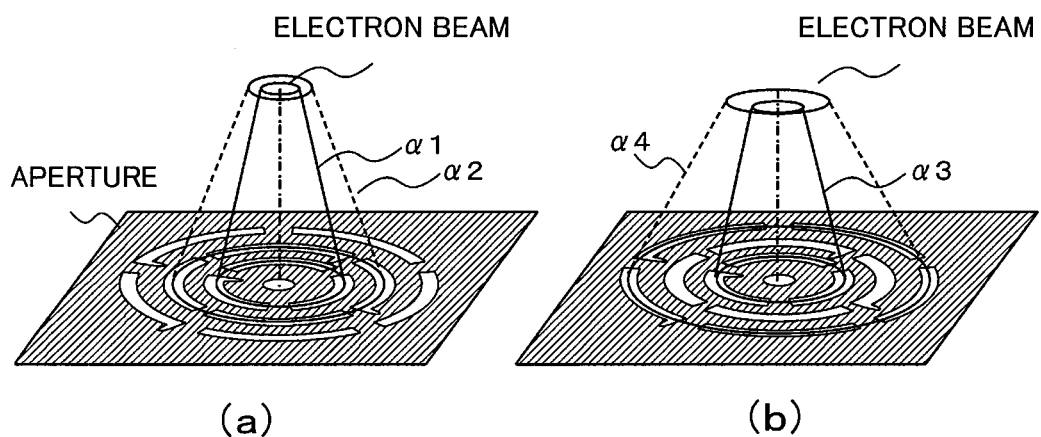
FIG. 2B is a diagram showing a relationship between each opening group and a convergence angle of the movable aperture shown in FIG. 2A.

Next, a configuration example of the movable aperture 31 for aberration measurement will be explained referring to FIG. 2 (FIG. 2A, FIG. 2B). The movable aperture 31 for aberration measurement has, as is shown in FIG. 2A, a first aperture part 200 that is provided on an aperture plate 310 and is equipped with a central opening placed on the optical-axis of primary charged particles, namely a first opening 210, and second aperture parts (201, 202) including a plurality of opening groups each of which are placed in an annular shape on a plurality of concentric circles having different radii at positions away from the first aperture part. That is, the second aperture part includes an aperture B (201) that has second opening groups 211, 212 that are in concentric circle shapes to a first aperture 210', and an aperture C (202) that has second opening groups 213, 214 that are in concentric circle shapes to a first aperture 210". In another words, the movable aperture 31 for aberration measurement of this embodiment includes a single-hole aperture located in the center (an aperture A) and a multiple-hole apertures having multiple holes placed on a plurality of concentric circles in a region whose radius is larger than this single-hole aperture (the aperture B, the aperture C).

The movable aperture 31 for aberration measurement of this embodiment is such that the first aperture part 200 and the second aperture parts 201 and 202 are placed at different positions on a straight line on a single sheet of the aperture plate 310. This movable aperture 31 is configured to be movable horizontally by the movable aperture micromotion mechanism 32 so that a central opening of any one of the central apertures may be located on the optical-axis.

Moreover, openings of the opening groups 201 and 202 that constitute the second aperture part are in annular shape formed along the concentric circles. That is, a plurality of openings placed on a concentric circle centered on the optical-axis are in the shape of an annular ring, and a cut or a nontransparent region that serves as a mark is provided at a specific phase on the annular ring for phase information extraction.

For example, the second opening group 201 (the aperture B) includes the central opening 210' of a radius (R0) equivalent to the opening 200 of the first aperture part, the opening group 211 of a radius R1 located on the outside of this central opening, and the opening group 212 of a radius R2 located on the outside thereof. On the other hand, the second opening group (the aperture C) includes the central opening 210" of a radius equivalent to the opening 200 of the first aperture part, the opening group 213 of a radius R3 located on the outside of this central opening, and the opening 214 of a radius R4 located in the outside thereof.

Radii of respective openings and respective opening groups are in a relation of R0<R3<R1<R2<R4. Therefore, as shown in FIG. 2B, in the movable aperture 31 for aberration measurement, the opening group 211 centered on the optical-axis comes to have a convergence angle α1, the opening group 212 comes to have a convergence angle α2 (See (a) in FIG. 2B), and the opening group 213 comes to have a convergence angle α3, and the opening group 214 comes to have a convergence angle of α4 ((b) in FIG. 2B).

By making the movable aperture 31 shift horizontally by means of the movable aperture micromotion mechanism 32, it is possible to switch any one of the first aperture part (the aperture A) of a beam convergence angle α=0, the second aperture part (the aperture B) of beam convergence angles α1, α2, and the second aperture part (the aperture C) of beam convergence angles α3, α4 to be on the optical-axis.

Furthermore, for the phase information extraction, a nontransparent region 220 and a cut 230 that serve as marks are provided at specific phases on each annular ring. The nontransparent region 220, i.e., the mark for extraction of the periodic information on the annular ring is in a placement that contains an n-period component on the annular ring for an n-th (n: an integer more than unity) aberration measurement. For example, three nontransparent regions are provided on the same circumference as of three openings in the opening group 211 and the opening group 213, four nontransparent regions are provided on the same circumference as of four openings in the opening 212, and five nontransparent regions are provided on the same circumference as of five openings in the opening 214. Incidentally, in the second-order aberration measurement, four opening groups and nontransparent regions (four is a multiple of 2) are used.

Moreover, in order to enable the mark for the phase information extraction on the annular ring to be determined as to which phase on the aperture the mark is, the mark for at least one period among n periods is specified to be a different mark (for example, the cut).

Moreover, the marks for the phase information extraction are placed at different periods, namely at different spacings in a circumferential direction, respectively. Furthermore, the marks for the phase information extraction are placed at different phases (for example, an inward cut and an outward cut in a radial direction), respectively.

Next, as an aberration measurement method that is processed mainly by the control unit 103, a method for measuring the aberrations of up to fifth-order using the movable aperture 31 for aberration measurement shown in FIG. 2 will be explained using a flowchart shown in FIG. 3.

At a time point of measurement start, the state shall be a state in which axis adjustment, etc. is conducted, a correction voltage can be superposed, and the SEM image can be acquired with the first opening 200 (the aperture A) of a convergence angle α=0 on the aperture surface.

(S10): An SEM image A is acquired with the first opening 200. This SEM image A is saved on the data storage 76.

(S11): The first opening 200 is changed to the second opening group 201 (the aperture B) of convergence angles α1 and α2 on the movable aperture 31. Aperture selection of the aperture A and the aperture B is done by changing a position of the aperture by means of the movable aperture micromotion mechanism 32: it is adjusted by the movable aperture micromotion mechanism 32 and the deflector 51 so that an opening center position of each aperture may be placed on the optical-axis.

(S12): An SEM image B is acquired. This SEM image B is saved on the data storage 76.

(S11c): The aperture is changed to the second opening group 202 (the aperture C) of convergence angles α3 and α4 on the movable aperture 31. Aperture selection of the apertures B and C is done by changing a position by means of the movable aperture micromotion mechanism 32, and the opening center position of each aperture is adjusted by the movable aperture micromotion mechanism 32 and the deflector 51 so as to be placed on the optical-axis.

(S12c): An SEM image C is acquired. This SEM image C is saved on the data storage 76.

(S13): The SEM images A, B, and C are read into the aberration arithmetic unit 79 through the control computer 30. Then, the SEM image B is deconvoluted with the SEM image A on the aberration arithmetic unit 79 to obtain a deconvolution image B'. Further, the SEM image C is also deconvoluted with the SEM image A on the aberration arithmetic unit 79 to obtain a deconvolution image C'.

(S14): Various aberration quantities are calculated from the image B' and the image C' on the aberration arithmetic unit 79.

(S15): The movable aperture 31 is changed to the first opening 200. Switchover from the second opening group 202 to the first opening 200 is done by changing a position of the opening by means of the movable aperture micromotion mechanism 32, and the opening center position is adjusted by the movable aperture micromotion mechanism 32 and the deflector 51 so as to be placed on the optical-axis. After the image is acquired, the aperture change may be conducted between operations of such as (S13) to (S16), etc. or in parallel with their operations.

(S16): Each of the obtained aberration quantities is compared with a threshold fixed in advance, and if it is less than or equal to the threshold, the flow will be terminated; if it is more than or equal to the threshold, the flow will proceed to (S17).

(S17): A correction quantity according to the aberration quantity is added (S10), then the flow returns to an aberration measurement loop from acquisition of the SEM image A.

Regarding the aberration quantity and the correction quantity, a relationship between the correction parameter and the amount of change in aberration is obtained in advance, and the correction parameter is altered in a direction in which the aberration becomes smaller. The correction parameters refer to the intensities of the dipole, the quadrupole, the hexapole, the octupole, and the dodecapole of the aberration corrector.

Aberration correction is performed by repeating the loop of (S10) to (S17) above.

Next, about calculation of the aberration quantities using the image B' and the image C' of (S14), an example of performing calculation of the aberration quantities will be explained in detail. For convenience, the image B' and image C' are hereafter called aberration figures here. The aberration quantity is calculable from the shape and size of the aberration figure and phase information.

Below, aberrations of up to the fifth-order are shown in FIG. 2, and examples of the aberration figures obtained by using the first opening (the single circular opening) 200 and the aperture of the second opening group (the annular ring openings) 201 are shown in FIG. 4 to FIG. 9. The aberrations of FIG. 4 to FIG. 9 are all zero except the aberration specified.

The aperture angle on the specimen surface of the beam formed from the central hole of the second opening group is set to 3 mrad, the incident angle of the beam from the inside annular ring to the specimen surface (=a tilt angle) is set to 20 mrad, the incident angle of the beam from the outside annular ring to the specimen surface is set to 30 mrad, and the region of the image is set to 80 μm×80 μm.

Incidentally, examples of FIG. 4 to FIG. 9 each show a state of an individual aberration obtained from some discrete electron microscopes. Moreover, FIG. 5 specially shows an example of the state outputted in the case where two kinds of aberrations among the aberrations of FIG. 4 exist together.

First, FIG. 4 shows examples of the aberration figures obtained from the first-order aberration. Taking a shape of C1: +1 μm shown in FIG. 4(a), the following shapes are obtained: in C1: −1 μm shown in FIG. 4(b), the shape rotated by 180°; in A1Re: +1 μm shown in FIG. 4(c), the shape inverted to the horizontal axis; in A1Re: −1 μm shown in FIG. 4(d), the shape inverted to the horizontal axis and rotated by 180°; in A1Im: +1 μm shown in FIG. 4(e), the shape inverted to the horizontal axis and rotated by −90°; and in A1Im: −1 μm shown in FIG. 4(f), the shape inverted to the horizontal axis and rotated by 90°. An inner diameter and a radius of the outline are proportional to C1 and magnitudes of the aperture angle and the convergence angle (hereinafter referred to simply as the convergence angle).

Examples of a case where the first-order aberrations exist together is shown in FIG. 5. In the case where only A1 aberrations exist together, when A1Re: +0.7 μm and A1Im: +0.7 μm shown in FIG. 5(a), since A1 aberrations are equivalent, the shape of the aberration figures is inverted to the horizontal axis with respect to FIG. 4(a) and is rotated by 45°, and when A1Re: +0.8 μm and A1Im: +0.6 μm shown in FIG. 5(b), since the aberration quantities are 4:3, the shape is inverted to the horizontal axis with respect to FIG. 4(a) and is rotated by about 38° (=3/7×90°.

In the case where C1 is intermingled with A1, when C1: +0.6 μm and A1Re: +0.3 μm shown in FIG. 5(c), since the aberration is cancelled in the vertical direction and is added together in the horizontal direction, the shape becomes an ellipse with the same phase with respect to FIG. 4(a), and when C1: −0.6 μm and A1Re: −0.3 μm shown in FIG. 5(d), since C1 is negative and the aberration is cancelled in the vertical direction and is added together in the horizontal direction, the shape becomes a shape rotated by 180° with respect to FIG. 5(c).

Even when the aberrations of different kinds like this exist together, the aberrations can be separated by means of shape, periodicity, and phase information.

FIG. 6 (FIG. 6A, FIG. 6B) is aberration figures of second-order aberrations. In the A2 aberration figures (a), (b), (c), and (d), breaks that are nontransparent parts of the outside annular ring become two from four. The breaks that become two are inverted by a sign of the aberration, and the phases of Re and Im intersect at right angles. In the B2 aberration figures (e), (f), (g), and (h), the break of the outside annular ring becomes two from four, a center hole and centers of aberration figures of the inside and outside annular rings move, their moving directions and the phase of the breaks are inverted by a symbol, and the moving directions of Re and Im intersect at right angles.

Figure 7A:
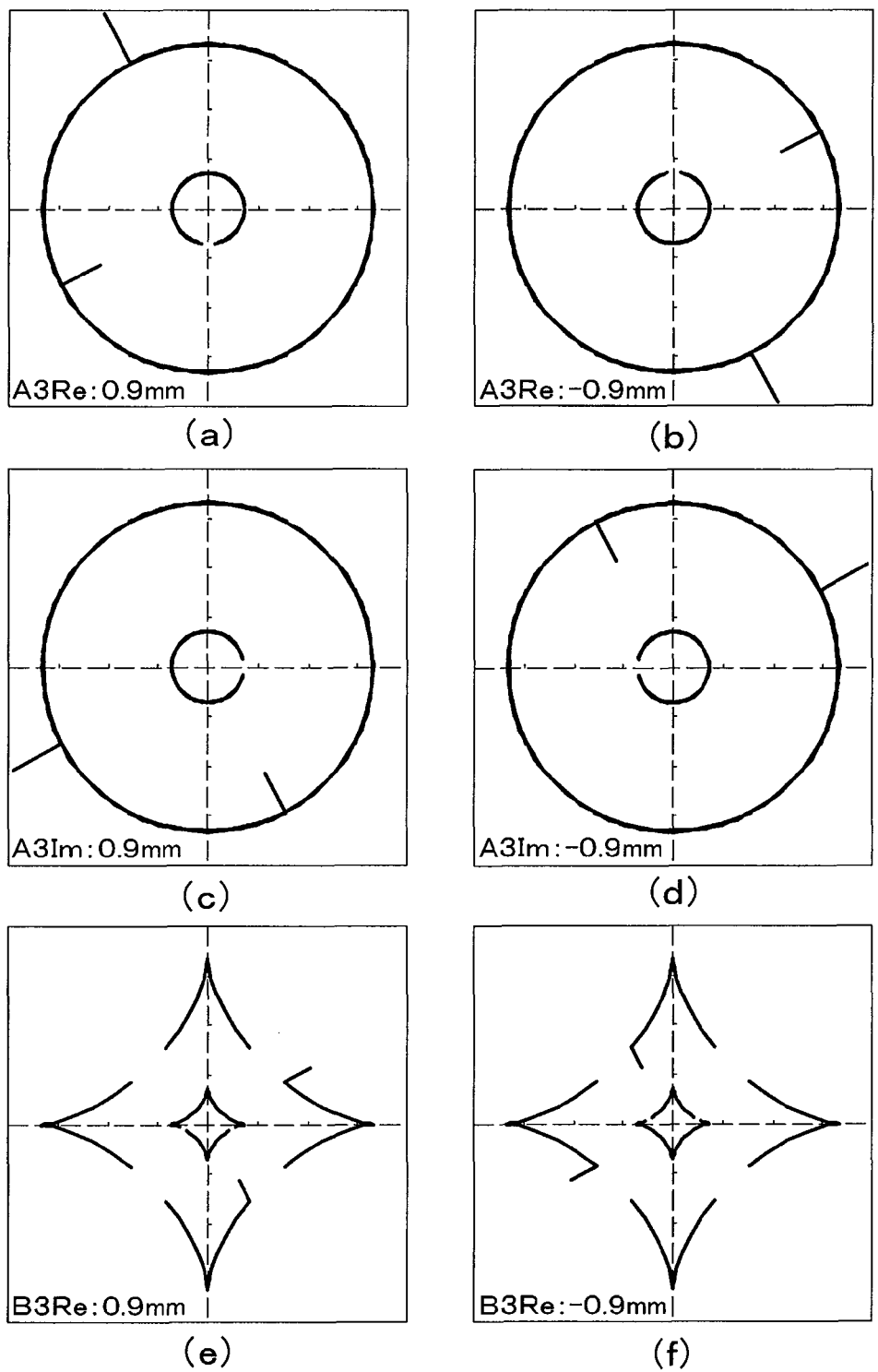
FIG. 7A is a diagram showing an example of third-order aberration figures according to the first embodiment.

FIG. 7 (FIG. 7A, FIG. 7B) is aberration figures of the third aberrations. In the A3 aberration figures shown in (a), (b), (c), and (d) of FIG. 7, the break in the inside annular ring becomes one from three, and the break that becomes one is inverted by a symbol of the aberration and phases of Re and Im intersect at right angles. The B3 aberration figures shown in (e), (f), (g), and (h) of FIG. 7 become a shape such that sides of a rectangle are bent towards the inside to be a circular arc shape, the break (phase) is inverted by a symbol of the aberration, and the phases of Re and Im become different by 45°. Although the C3 aberration figures shown in (i) and (j) of FIG. 7 are the same as C1 of FIGS. 4(a) and (b) in shape, symbol, and how the phase changes, the radius of the inside annular ring and the radius of the outside annular ring are proportional to the third power of the convergence angle and proportional to C3.

FIG. 8 (FIG. 8A, FIG. 8B) is aberration figures of the fourth aberrations. In the A4 aberration figures shown in (a), (b), (c), and (d) of FIG. 8, the break of the outside annular ring becomes one from four, and the break that becomes one is inverted by a symbol of the aberration, and the phases of Re and Im intersect at right angles. Although the B4 aberration figures shown in (e), (f), (g), and (h) of FIG. 8 make the same change as those of the B2 aberration figures, changes to the convergence angles are different: in contrast to B2 where the amount of movement and the magnitude of the aberration figure are proportional to the second power, in B4, they are proportional to the fourth power. Therefore, the amount of movement and the radius of the inside annular ring are relatively small to the outside annular ring. In the D4 aberration figures shown in (i), (j), (k), and (l) of FIG. 8, the breaks of the outside annular rings become two from four, the breaks that became two and the shape are inverted by a symbol of the aberration, and phases of Re and Im intersect at right angles.

Figure 9B:
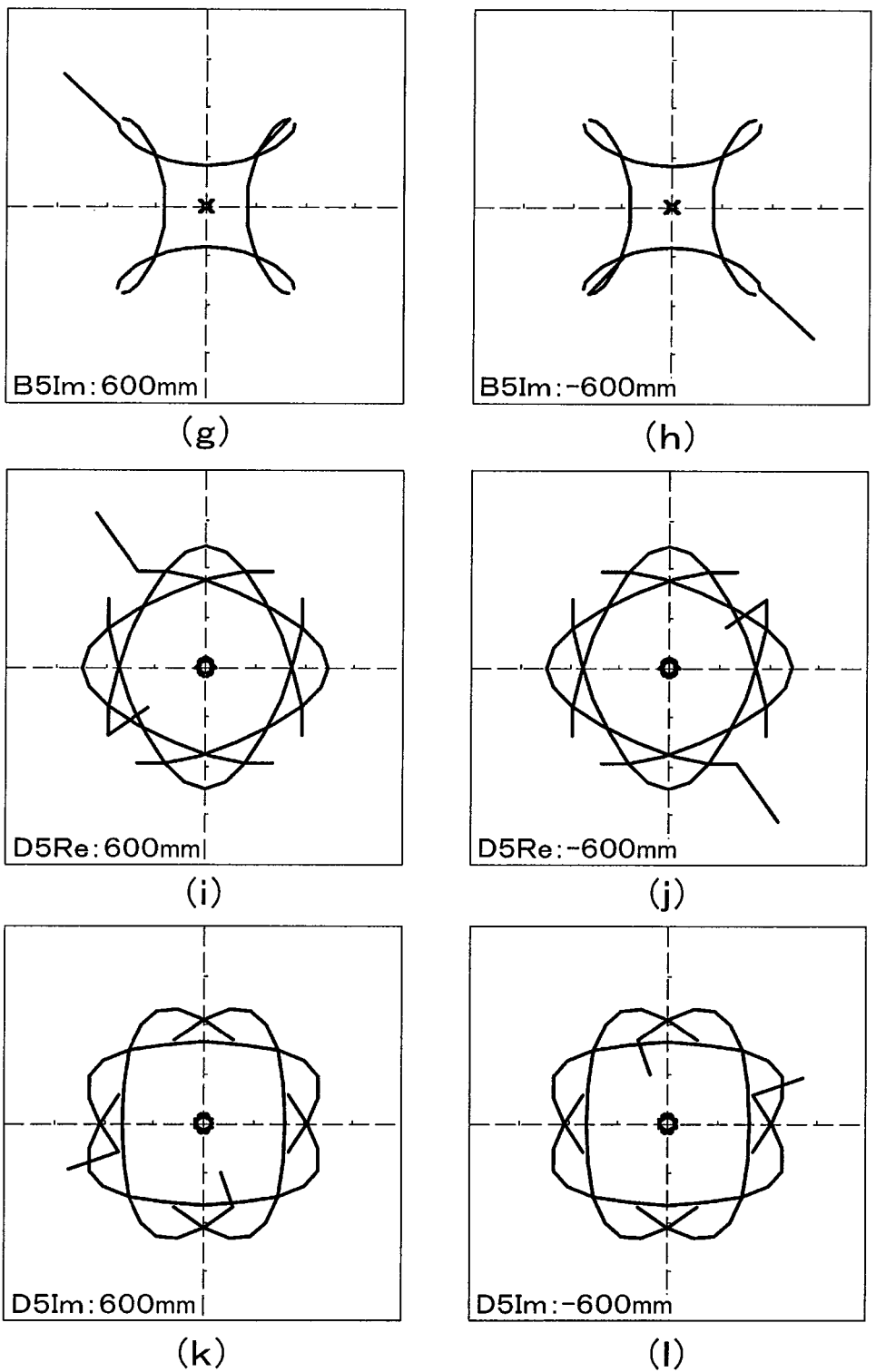
FIG. 9B is a diagram showing an example of fifth-order aberration figures according to the first embodiment.
Figure 9C:
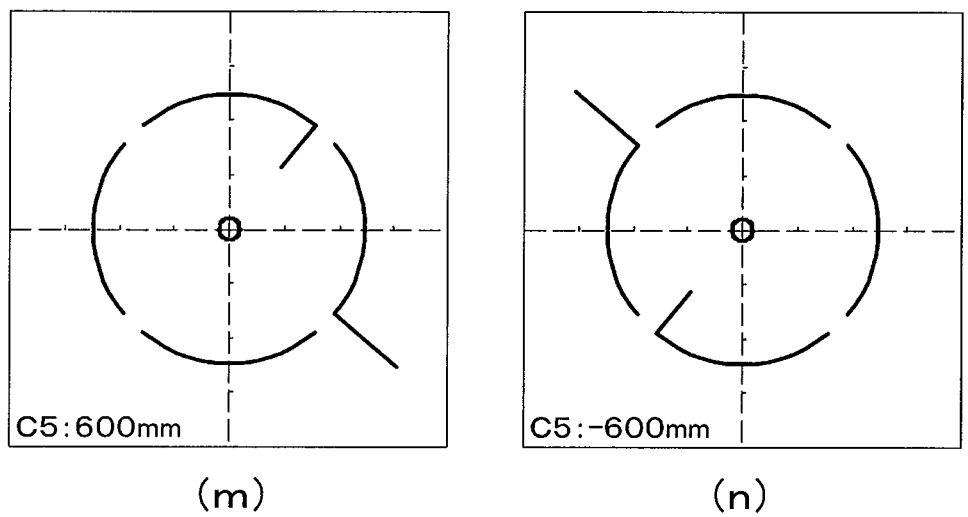
FIG. 9C is a diagram showing an example of fifth-order aberration figures according to the first embodiment.

FIG. 9 (FIG. 9A, FIG. 9B, and FIG. 9C) is aberration figures of the fifth aberrations. In the A5 aberration figures shown in (a), (b), (c), and (d) of FIG. 9, a break of the annular ring disappears, the period becomes five times, the phase is inverted to the horizontal axis, the phase is inverted by a symbol of the aberration, and the phases of Re and Im intersect at right angles. Although the breaks of the annular ring are placed at every 90° in this example, in the aberration figure having five breaks placed at every 72°, the number of breaks of the annular ring becomes one from five. Although the B5 aberration figures shown in (e), (f), (g), and (h) of FIG.

9 show the same change as those of the B3 aberration figures, changes to the convergence angles are different: since in B5, the size of the aberration figure is proportional to the fifth power in contrast to B3 where it is proportional to the third power, the amount of movement and the radius of the inside annular ring become relatively small to the outside annular ring. The D5 aberration figures shown in (i), (j), (k), and (l) of FIG. 9 become shapes each with eight vertexes, the break is changed from the vertex to the inside for Re and Im, the phase is inverted by a symbol, and the phases of Re and Im intersect at right angles. Although the C5 aberration figures shown in (m) and (n) of FIG. 9 are the same as C1 of FIGS. 4(*a*) and (*b*) in shape, sign, and how the phase changes, the radius of the inside annular ring and the radius of the outside annular ring are proportional to the fifth power of the convergence angle and C5.

The diagram actually outputted becomes a complicated diagram obtained by synthesizing FIG. 4 and FIG. 6 to FIG. 9 according to the aberration quantity that exists in an individual electron microscope. Therefore, the aberrations can be calculated by fitting (Formula 1) to (Formula 5) that will be described below to these respective diagrams.

That is, in (S14) of FIG. 3, aberration numerization in processing of calculating various aberration quantities from the image B' and the image C' on the arithmetic unit 79 is obtained by putting functions of (Formula 1) to (Formula 6) shown below into the fitting.

[Numerical Expression 1]
First-order aberration:

$$\begin{pmatrix} x_1 \\ y_1 \end{pmatrix} = \alpha \begin{pmatrix} \cos(\theta) \cdot (C1 + A1\text{Re}) + \sin(\theta) \cdot A1\text{Im} \\ \sin(\theta) \cdot (C1 + A1\text{Re}) + \cos(\theta) \cdot A1\text{Im} \end{pmatrix} \quad \text{(Formula 1)}$$

Second-order aberration:

$$\begin{pmatrix} x_2 \\ y_2 \end{pmatrix} = \alpha^2 \begin{pmatrix} 2/3 \cdot B2\text{Re} + \cos(2\theta)(A2\text{Re} + B2\text{Re}/3) + \\ \sin(2\theta) \cdot (A2\text{Im} + B2\text{Im}/3) \\ 2/3 \cdot B2\text{Im} + \sin(2\theta) \cdot (-A2\text{Re} + B2\text{Re}/3) + \\ \cos(2\theta) \cdot (A2\text{Im} - B2\text{Im}/3) \end{pmatrix} \quad \text{(Formula 2)}$$

Third-order aberration:

$$\begin{pmatrix} x_3 \\ y_3 \end{pmatrix} = \quad \text{(Formula 3)}$$

$$\alpha^3 \begin{pmatrix} \cos(\theta) \cdot \left(C3 + \frac{3}{4} \cdot B3\text{Re}\right) + \sin(\theta) \cdot \left(\frac{3}{4} \cdot B3\text{Im}\right) + \\ \cos(3\theta) \cdot \left(A3\text{Re} + B3\frac{\text{Re}}{4}\right) + \sin(3\theta) \cdot \left(A3\text{Im} + B3\frac{\text{Im}}{4}\right), \\ \sin(\theta) \cdot \left(C3 - \frac{3}{4} \cdot B3\text{Re}\right) + \cos(\theta) \cdot \left(\frac{3}{4} \cdot B3\text{Im}\right) + \\ \sin(3\theta) \cdot \left(-A3\text{Re} + B3\frac{\text{Re}}{4}\right) + \cos(3\theta) \cdot \left(A3\text{Im} + B3\frac{\text{Im}}{4}\right) \end{pmatrix}$$

Fourth-order aberration:

$$\begin{pmatrix} x_4 \\ y_4 \end{pmatrix} = \alpha^4 \begin{pmatrix} \frac{3}{5} \cdot B4\text{Re} + \cos(2\theta) \cdot \left(\frac{2}{5} \cdot B4\text{Re} + \frac{4}{5} \cdot D4\text{Re}\right) + \\ \sin(2\theta) \cdot \left(\frac{4}{5} \cdot D4\text{Im} + \frac{2}{5} \cdot B4\text{Im}\right) + \cos(4\theta) \cdot \\ (D4\text{Re}/5 + A4\text{Re}) + \sin(4\theta) \cdot (A4\text{Im} + D4\text{Im}/5), \\ \frac{3}{5} \cdot B4\text{Im} + \sin(2\theta) \cdot \left(\frac{2}{5} \cdot B4\text{Re} - \frac{4}{5} \cdot D4\text{Re}\right) + \\ \cos(2\theta) \cdot \left(\frac{4}{5} \cdot D4\text{Im} - \frac{2}{5} \cdot B4\text{Im}\right) + \sin(4\theta) \cdot \\ (D4\text{Re}/5 - A4\text{Re}) + \cos(4\theta) \cdot (A4\text{Im} - D4\text{Im}/5) \end{pmatrix} \quad \text{(Formula 4)}$$

Fifth-order aberration:

$$\begin{pmatrix} x_5 \\ y_5 \end{pmatrix} = \alpha^5 \begin{pmatrix} \cos(\theta) \cdot \left(C5 + \frac{2}{3} \cdot B5\text{Re}\right) + \frac{2}{3} \cdot \sin(\theta) \cdot B5\text{Im} + \\ \cos(3\theta) \cdot \left(B5\text{Re}/3 + \frac{5}{6} \cdot D5\text{Re}\right) + \\ \sin(3\theta) \cdot \left(\frac{5}{6} \cdot D5\text{Im} + B5\text{Im}/3\right) + \cos(5\theta) \cdot \\ (D5\text{Re}/6 + A5\text{Re}) + \sin(5\theta) \cdot (A5\text{Im} + D5\text{Im}/6), \\ \sin(\theta) \cdot \left(C5 - \frac{2}{3} \cdot B5\text{Re}\right) + \frac{2}{3} \cdot \cos(\theta) \cdot B5\text{Im} + \\ \sin(3\theta) \cdot \left(B5\text{Re}/3 - \frac{5}{6} \cdot D5\text{Re}\right) + \\ \cos(3\theta) \cdot \left(\frac{5}{6} \cdot D5\text{Im} - B5\text{Im}/3\right) + \sin(5\theta) \cdot \\ (D5\text{Re}/6 - A5\text{Re}) + \cos(5\theta) \cdot (A5\text{Im} - D5\text{Im}/6) \end{pmatrix} \quad \text{(Formula 5)}$$

Here, x and y are coordinates when the aberration figure is expressed by a rectangular coordinate system, and a subscript represents the order, α represents a convergence angle (an aperture angle) on the specimen surface, and θ presents a phase on the aperture. Therefore, the coordinates including aberrations of up to the fifth-order are expressed by Formula 6.

[Numerical expression 2]

$$\begin{pmatrix} x \\ y \end{pmatrix} = \begin{pmatrix} x_1 + x_2 + x_3 + x_4 + x_5 \\ y_1 + y_2 + y_3 + y_4 + y_5 \end{pmatrix} \quad \text{(Formula 6)}$$

There are 12 aberration coefficients of up to the third-order and 15 aberration coefficients from the fourth-order to the fifth-order. Among these, since C1, C3, and C5 have the same period, at least two kinds of convergence angles are needed to obtain up to C3 and three kinds of convergence angles are needed to obtain up to fifth-order C5. In order to solve Formula 6 as simultaneous equations, since coefficients to be obtained are 12 in the case of solving up to the third-order aberration coefficients, if there are three conditions of the phases θ containing two kinds of convergence angles, namely six coordinates of the aberration FIG. 6, it can be solved. In the case of solving up to the fifth aberration coefficients, since the coefficients to be obtained are 27, if there are seven conditions of the phases θ containing three kinds of convergence angles, namely 14 coordinates, it can be solved.

In the above, although a relationship between the aberration coefficient and the aberration figure is shown, the aberrations are not limited to the example of FIG. 5, but there are a plurality of aberrations between the orders and within the order. Therefore, if the shape of the aperture and the control method are selected and changed according to each aberration, it is possible to obtain the aberration efficiently taking a balance of time and accuracy or precision.

For example, in the case of measuring the aberrations of up to the third-order, what is necessary is to use only the annular ring opening 201 (the aperture B) as the second opening group of the movable aperture 31 for aberration measurement. That is, in the flowchart of FIG. 3, first the SEM image A is acquired (S10), further, change to the aperture B is conducted by control of the movable aperture 31 (S11), the SEM image B is acquired (S12), and the deconvolution image B' is obtained by deconvoluting this SEM image B with the SEM image A (S13). Other processing (S14 to S17) is the same as those of the first embodiment.

Incidentally, with the annular ring aperture, since correspondence between θ and coordinates can be found from the cut and the nontransparent region on the annular ring and fitting to a line of the aberration figure can be performed, even if a necessary number of coordinates is not fulfilled, the aberration can be calculated.

According to this embodiment, it is possible to collectively acquire a plurality of images in the circumferential direction by the multiple-hole aperture with multiple holes whose radii (convergence angles) are different provided in the aperture for aberration measurement and regarding images of a plurality of convergence angles, it is possible to extract the aberration of a specific order being highlighted by selection of the multiple-hole aperture. Therefore, measurement of high-order aberrations can be performed in a short time without deteriorating accuracy or precision. For this reason, it is possible to lessen a damage given to the specimen, to increase a throughput in a semiconductor measuring apparatus, and to reduce a load to an operator in manual correction. Furthermore, it is possible to increase a measurement accuracy or precision of the aberration corresponding to the period by changing the number and phase of the nontransparent parts of the annular ring.

In the foregoing, by the technique explained by this embodiment, it is possible to perform the measurement of high-order aberrations, i.e., the third aberration and the fifth aberration, in a short time without deteriorating accuracy or precision.

Second Embodiment

Figure 10:
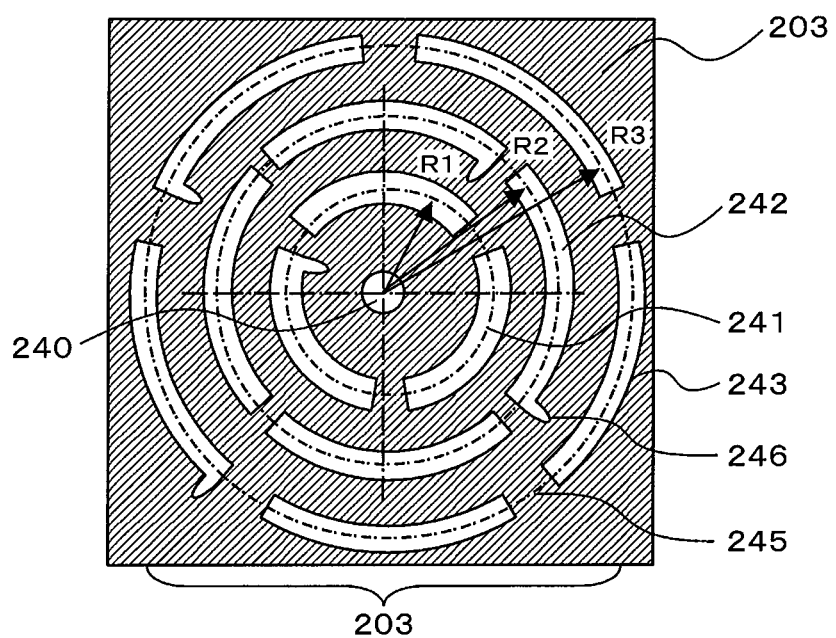
FIG. 10 is an explanatory diagram of an aperture for aberration measurement according to another embodiment of the present invention.

Next, a second embodiment of the present invention will be described using FIG. 10 and FIG. 11. As another embodiment of the aperture 31 for aberration measurement for measuring the aberrations of up to the fifth-order, an annular ring opening 203 (a second aperture D) as shown in FIG. 10 may be used for the second opening group instead of the annular ring openings (the second aperture) 201, 202 of the first embodiment. This annular ring opening 203 includes the three opening groups 241, 242, and 243 placed on three concentric circles whose centers are the same as that of a central first opening 240. Furthermore, there are provided the nontransparent region 245 and the cut 246 that serve as marks for specific phases on each annular ring in each opening group for the phase information extraction. A first aperture 240 also serves as the central opening of the second aperture.

Figure 11:
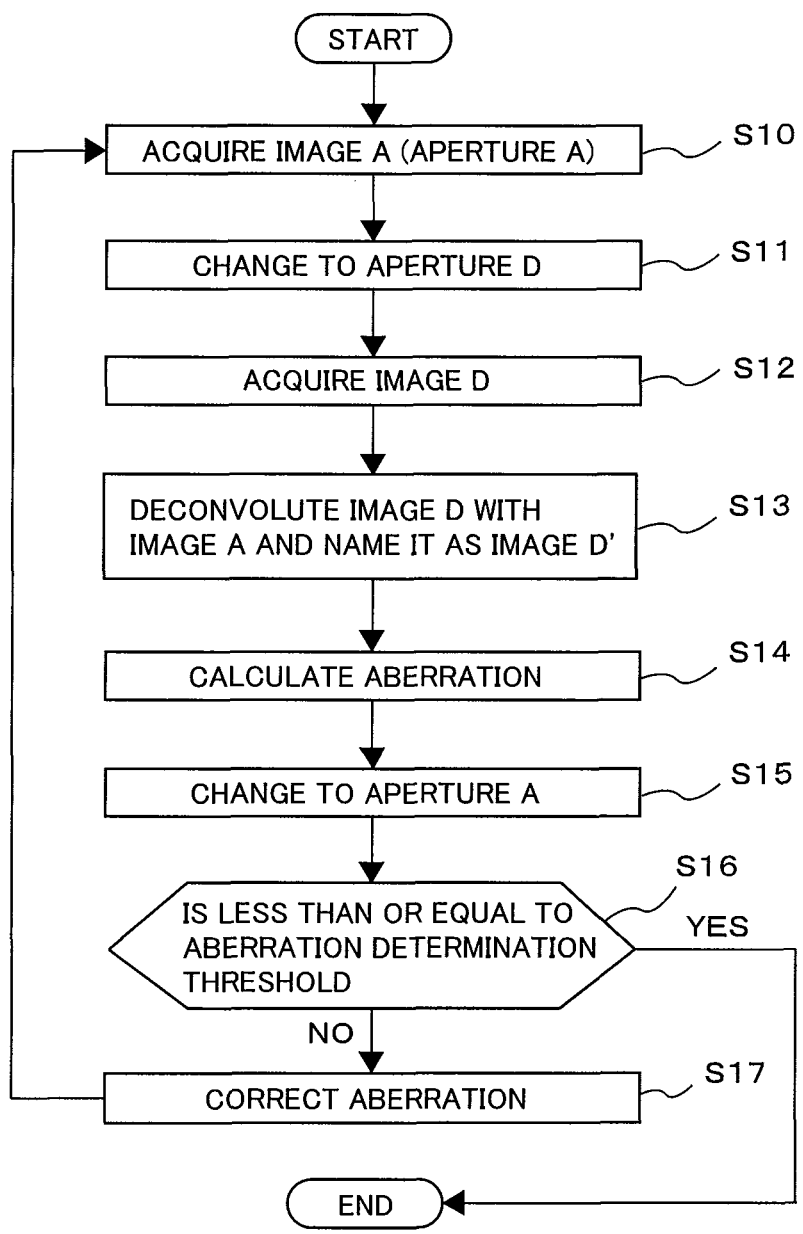
FIG. 11 is a flowchart of the aberration corrector adjustment according to another embodiment of the present invention.

When measuring the aberrations of up to the fifth-order using the aperture D of the second embodiment, in the flowchart of FIG. 11, first the SEM image A is acquired (S10), then change to the aperture D shown in FIG. 10 is conducted by control of the movable aperture 31 (S11), and the SEM image D is acquired (S12). Then, by deconvoluting this SEM image D with the SEM image A, the deconvolution image D' can be obtained (S13). Other processing (S14 to S17) is the same as the first embodiment.

Also in this embodiment, a high-order aberration measurement can be performed in a short time without deteriorating accuracy or precision. For this reason, it is possible to lessen the damage given to the specimen, to increase the throughput in the semiconductor measuring apparatus, and to reduce the load to the operator in manual correction. Furthermore, it is possible to improve the measurement accuracy or precision of the aberrations corresponding to the period by changing the number and phases of the nontransparent parts of the annular ring.

Third Embodiment

Next, a third embodiment where the aberrations of up to fifth-order are measured using the aperture D of the second embodiment will be explained using FIG. 10 and FIG. 12 to FIG. 14. This embodiment shows an example of an aberration measurement method by means of change of a crossover point position instead of the aberration measurement method by means of the movable aperture of the first embodiment. A scanning electron microscope to which this embodiment is applied shall adopt the configuration shown in FIG. 1 like the first embodiment. However, as the aperture for aberration measurement, an aperture of the annular ring opening 203 shown in FIG. 10 (a fixed aperture) is adopted instead of the movable aperture 31. This aperture has an opening 240 that is common to the first and second apertures in the center of the plate. Furthermore, the scanning electron microscope is equipped with a crossover point change function.

Figure 12:
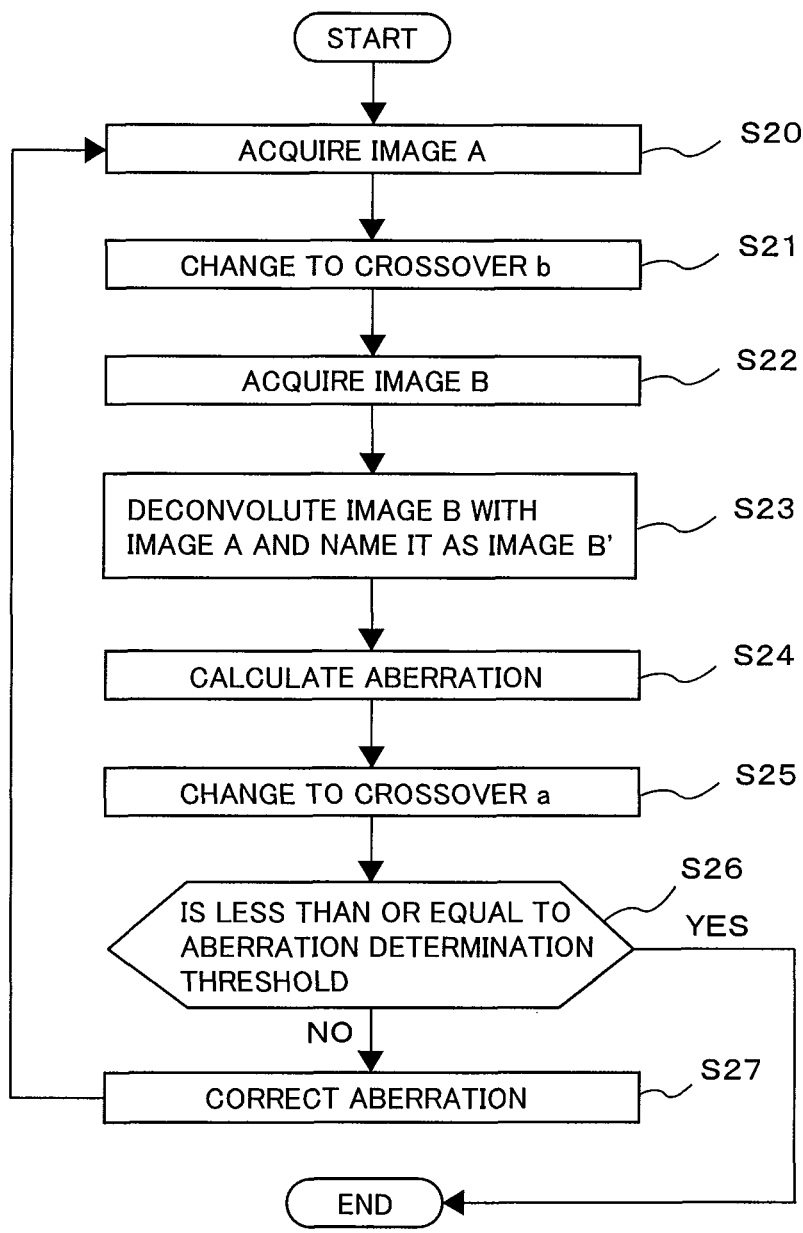
FIG. 12 is a flowchart of the aberration corrector adjustment according to another embodiment of the present invention.

A flowchart of the aberration measurement according to this embodiment is shown in FIG. 12. At the time point of the start, its state shall be a state in which the axis adjustment, etc. is conducted, the correction voltage can be superposed, and the SEM image can be acquired. The annular ring opening 203 is inserted into the aperture, and the electron beam is irradiated onto a region that includes only the circular opening in the center as shown in FIG. 14(a). A position of the crossover point in this state is designated as a crossover point "a", and is specified to be at a crossover point position 300 shown in FIG. 13(a). FIG. 13 is a schematic diagram of an optical system showing the electron beam travelling from the electron source to enter the aberration corrector. The change of the crossover point in the flowchart is conducted by changing the intensity of the first condenser lens 6, and after the change of the crossover point, the deflector 51 is adjusted so that the electron beam may be irradiated onto the optical-axis that is an opening center position and the intensity of the second condenser lens 7 is adjusted so that the beam having passed through the second condenser lens 7 may be maintained parallel to the optical-axis.

(S20): The SEM image A is acquired at the crossover point "a". The SEM image A is saved on the data storage 76.

Figure 14:
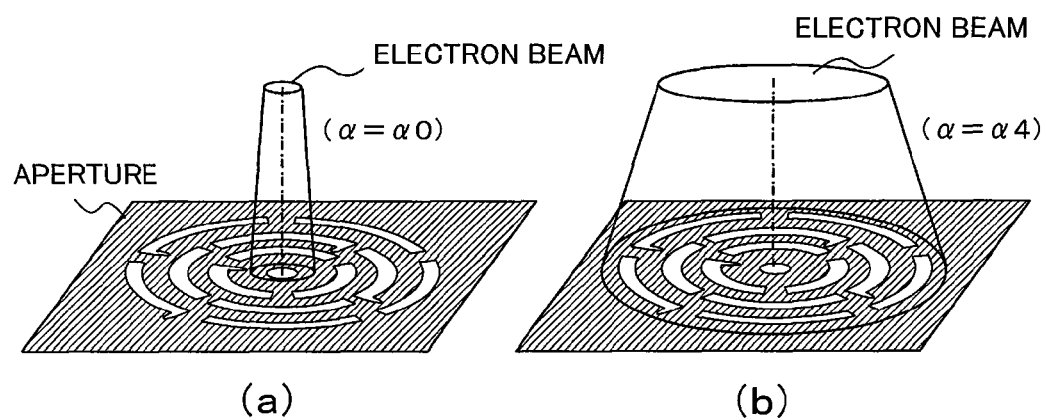
FIG. 14 is an explanatory diagram of a beam state on an annular ring aperture in another embodiment of the present invention.

(S21): By changing excitation of the first condenser lens, the crossover point is changed to a crossover point "b" position 301 as shown in FIG. 13(b). At the crossover point "b", the electron beam covers all the openings of the annular ring opening 203, as shown in FIG. 14 (b).

(S22): The SEM image B is acquired. The SEM image A and the SEM image B are saved on the data storage 76, and can be read by the aberration arithmetic unit 79 through the control computer 30.

(S23): The SEM image B is deconvoluted with the SEM image A on the aberration arithmetic unit 79 to obtain the deconvolution image B'.

(S24): Various aberration quantities are calculated from the image B'. Incidentally, the aberration arithmetic unit can also be incorporated in the control computer 30 as an aberration operation program.

(S25): A change to the crossover point "a" is conducted. If the change to the crossover point is after image acquisition, it may be conducted between operations of (S23) to (S26), etc. or in parallel with their operations.

(S26): Each of the obtained aberration quantities is compared with the threshold fixed in advance, and if it is less than or equal to the threshold, the flow will be terminated; if it is more than or equal to the threshold, the flow will proceed to (S27).

(S27): The correction quantity according to the aberration quantity is added (S20), and the flow returns to the aberration measurement loop from the acquisition of the SEM image A. Finally, the aberration correction is carried out by repeating the loop. The image B' obtained here is equivalent to one that is obtained with the use of the annular opening 203 for the second opening group in the first embodiment. Therefore, after this, calculation of the aberration quantity from the image B' can be obtained by the same technique as of the first embodiment.

Also in this embodiment, the high-order aberration measurement can be performed in a short time without deteriorating accuracy or precision. For this reason, it is possible to lessen the damage given to the specimen, to increase the throughput in the semiconductor measuring apparatus, and to reduce a load on an operator in manual correction. Furthermore, it is possible to improve the measurement accuracy or precision of the aberration corresponding to the period by changing the number and phases of the nontransparent parts of the annular ring.

Fourth Embodiment

A fourth embodiment of the present invention will be explained using FIG. 15 and FIG. 16. The technique of the present invention is applicable not only to an aberration calculation method used in the first embodiment but also to one that performs the aberration measurement by changing a focus position of the beam on the specimen surface. Here, as an example of it, one in which an invention of an aberration calculation method described in Japanese Patent Application No. 2008-040815 that was previously proposed by the inventors will be shown. The invention described in Japanese Patent Application No. 2008-040815 is a technique of finding the geometrical aberrations of the first-order to the fifth-order by changing the focus position of the beam on the specimen surface. This technique needs images of the beam that are tilted at a plurality of phases for a high-accuracy measurement and has a problem of taking time for the measurement.

In this embodiment, an example where an aberration measurement method by changing the crossover point position is used will be shown. Incidentally, an example using an aberration measurement method by means of the movable aperture is also possible. However, the aperture uses not the annular ring opening but circular openings (a fixed aperture) on the concentric circle. Here, as an example, one such that a circular opening 250 is formed on the aperture plate 310 shown in FIG. 16(a) is used. A circular opening 204 has an independent opening 252 on its outermost side, which is used for phase check, playing the same role as of the cut of the annular ring aperture. A fundamental configuration and a method other than the aperture are the same as those of the third embodiment, and its flowchart is shown in FIG. 15. The change to the crossover point "a" and the crossover point "b", and adjustment of the condenser lens and its axis accompanying it are in the same state as of the third embodiment. Moreover, regarding acquisition of an SEM image B(n) by defocusing, there is shown an example of a case where, using the acquisition condition of the SEM image A with the defocus offset j added as a reference, the following (N+M+1) images are acquired: N images taken in a negative direction from the reference with defocus intervals $\Delta f$; M images taken in a positive direction; and one image taken at a reference position.

Figure 15:
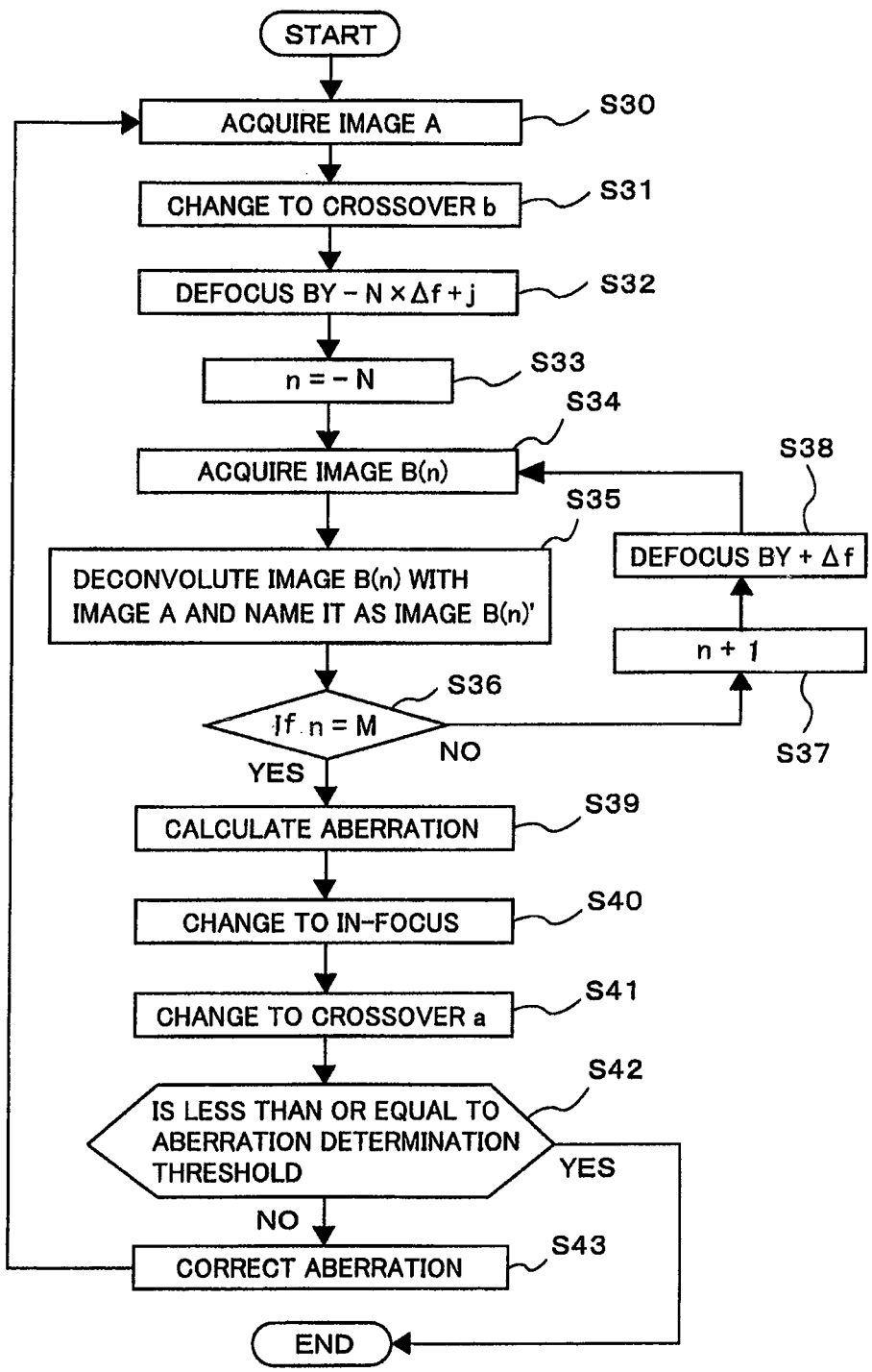
FIG. 15 is a flowchart of the aberration corrector adjustment according to another embodiment of the present invention.
Figure 16:
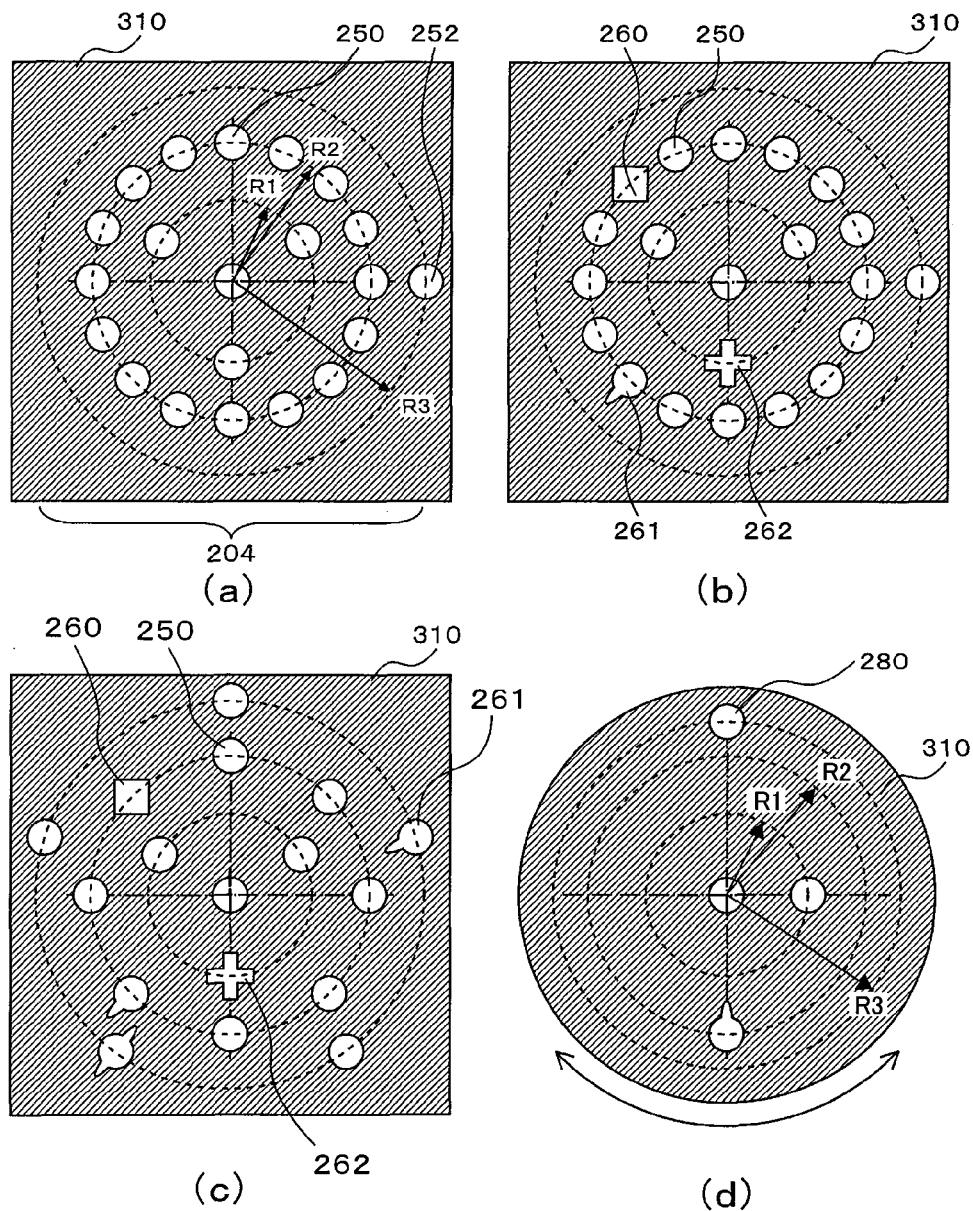
FIG. 16 is a diagram showing an example of a multiple-hole aperture by another embodiment of this invention.

In the flowchart of FIG. 15, at the time point of the start, the state shall be a state in which the axis adjustment, etc. is conducted, the correction voltage can be superposed, and the SEM image can be acquired. The circular opening 204 of FIG. 16(a) is inserted into the aperture, which is made to be in a state of the crossover point "a".

(S30): First, the SEM image A is acquired. The SEM image A is saved on the data storage 76.

(S31): By changing excitation of the first condenser lens and the second condenser lens, the optical system is made to be in a state of crossover point "b".

(S32): A focus of the objective lens is made to change by $-N\Delta f + j$ (defocus).

(S33): The state is specified to be an image acquisition state $n=-N$.

(S34): The SEM image B(n) is acquired. The SEM image B is saved on the data storage 76.

(S35): The SEM image B(n) is deconvoluted with the SEM image A on the aberration arithmetic unit 79 to obtain a deconvolution image B'(n). Moreover, if an arithmetic operation of deconvolution is before an aberration calculation, it may be calculated in parallel with operations, i.e., during defocus of (S36) to (S38), and the like.

(S36): If the flow is not in an image acquisition state n=M, the flow will proceed to (S37).

(S37): Unity is added to the image acquisition state n.

(S38): The focus of the objective lens is shifted by $+\Delta f$. Steps of (S34) to (S38) are repeated until the state becomes the image acquisition state n=M.

(S39) The amount of astigmatism in an angular direction is calculated from an obtained deconvolution spot image B(n)' to calculate the aberration quantity. The calculation of the amount of astigmatism from the spot is a publicly known technology.

(S40): The focus of the objective lens is changed to be in focus (is shifted by $-M\Delta f - j$), and the state thereof is returned to a state in which the image is acquired (S30).

(S41): By changing the excitation of the first condenser lens and the second condenser lens, the state is changed to the state of the crossover point "a".

(S40) and (S41) have no particular order, and may be operated in parallel with (S39) and (s41).

(S42): Each of the obtained aberration quantities is compared with the threshold fixed in advance, and if it is less than or equal to the threshold, the flow will be terminated; if it is more than or equal to the threshold, the flow will proceed to (S43).

(S43): The correction quantity according to the aberration quantity is added (S30), and the flow will return to the aberration measurement loop of the acquisition of the SEM image A. The aberration correction is carried out by repeating the loop.

Also in this embodiment, it is possible to perform the high-order aberration measurement in a short time without deteriorating accuracy or precision. For this reason, it is possible to lessen the damage given to the specimen, to increase the throughput in the semiconductor measuring apparatus, and to reduce the load to the operator in manual correction.

Furthermore, it is possible to improve the measurement accuracy or precision of the aberration corresponding to the period by changing the number and phase of the nontransparent parts of the annular ring.

Fifth Embodiment

Although for the movable aperture and the fixed aperture of respective embodiments mentioned so far, the examples where the annular ring opening extending in the circumferential direction is used are shown, the present invention is not limited to the annular ring opening and a group of openings of arbitrary shapes placed on concentric circles may be used. Here, an embodiment about such opening shapes will be shown. As such opening shapes, there are various kinds of shapes shown in FIG. 16 and the like. Regarding (a), (b), and (c) of FIG. 16, the number of the circular openings 250 provided on the aperture plate 310 is 14 or more, including three kinds of convergence angles (R1, R2, and R3). Regarding the phase information, especially in (b) and (c) of FIG. 16, a contrivance that makes the phase information clear by preparing openings being given a square 260, a break 261, and a cross 262 in addition to the circular opening 250 is performed. In FIG. 16 (c), a placement that includes 2, 3, 4, and 5 periods is conducted for a placement of the openings (250, 260, 261, and 262).

Moreover, in FIG. 16(d), a single opening 280 is provided for each of three kinds of convergence angles (R1, R2, and R3), respectively, a rotating mechanism is attached to the aperture, and the aperture is rotated to an arbitrary phase, which enables an image to be acquired. Since three coordinates are acquirable by three kinds of convergence angles in a single time of acquisition of the SEM image, if five SEM images with varied phases are acquired, sufficient coordinate information can be obtained. Also in this embodiment, it is possible to perform the high-order aberration measurement in a short time without deteriorating accuracy or precision. In this embodiment, although an advantage of being able to acquire collectively is thinned, it is possible to avoid a situation where beams are overlapped and are hard to be separated.

Sixth Embodiment

Figure 17:
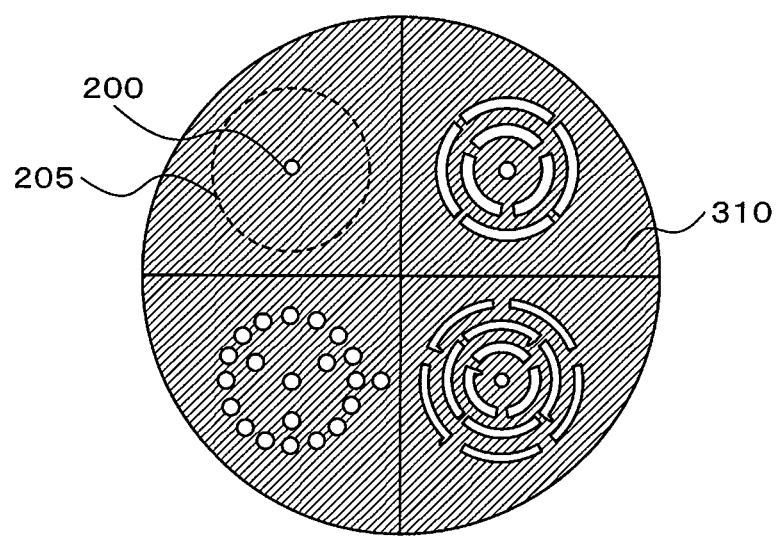
FIG. 17 is a diagram showing an example of the movable aperture according to another embodiment of the present invention.

Another example of the aperture plate shape of a movable aperture system of the present invention is shown in FIG. 17. The aperture plate 310 is divided into four in the circumferential direction, and openings of different kinds are placed in a beam irradiation region 205 of each region. That is, in the center of each region, the central opening (the first aperture part) 200 placed on the optical-axis of the primary charged particles or a central opening equivalent thereto is provided. Moreover, in three regions different from the region having only the first aperture part 200, openings of different kinds (the second aperture part) are provided concentrically on the outside of the central opening. Furthermore, the aperture plate 310 is equipped with a rotating mechanism as the movable aperture micromotion mechanism 32, and any one of the four kinds of openings is placed in the beam irradiation region 205 by the opening plate 310 rotating about its center as an axis. Thus, the movable aperture of this embodiment has a mechanism that switches the first aperture or the second aperture to be on the optical-axis by rotating the aperture plate 310.

Also in this embodiment, it is possible to perform the high-order aberration measurement in a short time without deteriorating accuracy or precision. For this reason, it is possible to lessen the damage given to the specimen, to increase the throughput in the semiconductor measuring apparatus, and to reduce the load to the operator in manual correction.

DESCRIPTION OF REFERENCE NUMERALS

1—Schottky electron source,
2—Suppresser electrode,
3—Extraction electrode,
4—First anode,
5—Second anode,
6—First condenser lens,
7—Second condenser lens,
8—Deflector,
10—Aberration corrector,
15—Scanning deflector,
16—Lower scanning coil,
17—Objective lens,
18—Specimen,
20—Electron gun power supply,
21—Control voltage source,
22—Acceleration voltage source,
23—First condenser lens power supply,
24—Second condenser lens power supply,
25—Deflection coil power supply,
26—Aberration corrector power supply,
27—Scanning coil power supply,
28—Objective lens power supply,
29—Retarding power supply,
30—Control computer,
31—Movable aperture,
32—Movable aperture micromotion mechanism,
33—Movable aperture,
35—Astigmatism correction coil power supply,
36—Astigmatism correction coil,
37—Objective aligner power supply,
38—Objective aligner,
50—Deflector power supply,
51—Deflector,
60—Optical-axis,
71—E×B deflector,
72—Reflector plate,
73—Secondary-electron detector,
74—Secondary-electron detector power supply,
75—E×B deflector power supply,
76—Data storage,
77—Monitor,
78—Console,
79—Aberration arithmetic unit,
80—Specimen stage,
81—Specimen stage control mechanism,
90—Vacuum vessel,
101—Column,
102—Specimen chamber,
103—Control unit,
200—Single circular opening,
201—Annular ring opening,
202—Annular ring opening,
203—Annular ring opening,
204—Circular opening,
205—Beam irradiation region,
300—Crossover point a,
301—Crossover point b, and
310—Aperture plate.

The invention claimed is:

1. A charged particle beam apparatus, comprising:
a specimen stage on which a specimen is mounted;
an irradiation optical system for scanning a primary charged particle beam on the specimen mounted on the specimen stage;
a detector for detecting secondary charged particles generated by the scanning of the charged particle beam;
display means for displaying an output signal of the detector as an image; and
an arithmetic unit for detecting aberrations;
wherein the irradiation optical system comprises:
an aberration corrector for correcting the aberrations of the primary charged particle beam emitted from a charged particle beam source; and
an aperture for aberration measurement placed between the charged particle beam source and the aberration corrector,
wherein the aperture for aberration measurement comprises:
a first aperture part equipped with a central opening placed on an optical-axis of primary charged particles emitted from the charged particle beam source; and
a second aperture part having a plurality of openings placed on a plurality of concentric circles with different radii around the central opening and outside the central opening each in an annular shape centered on the optical-axis,
wherein the arithmetic unit is configured to acquire a first image acquired by the charged particle beam having passed through only the opening of the first aperture part, and a second image acquired in the same scanning region as that of the first image by the charged particle beam having passed through the plurality openings of the second aperture part, and configured to measure the aberrations from the first image and the second image,
the second aperture has a plurality of groups of openings that are placed in an annular ring shape along the concentric circles centered on the optical-axis, and a cut or nontransparent region that serves as a mark provided at a specific phase on the annular ring for extraction of phase information.

2. The charged particle beam apparatus according to claim 1,
wherein the aperture for aberration measurement is a movable aperture such that the first aperture part and the second aperture part are placed at different places on the same aperture plate, and
wherein one of the first aperture part and the second aperture part can be moved onto the optical-axis.

3. The charged particle beam apparatus according to claim 1,
wherein the aperture for aberration measurement has the central opening that is common to the first aperture part and the second aperture part, and the first aperture part and the second aperture part are placed concentrically centered on the optical-axis.

4. The charged particle beam apparatus according to claim 3,
wherein the irradiation optical system is configured to switch the irradiation region on the aperture surface of the electron primary charged particles to either a region including only the central aperture or a region including the first aperture part and the whole of the second aperture part.

5. The charged particle beam apparatus according to claim 1,
wherein the irradiation optical system is configured to change a region including only the first aperture part and a region of the second aperture part and acquiring the first image and the second images whose foci on the specimen surface are changed.

6. The charged particle beam apparatus according to claim 1,
wherein the arithmetic unit is configured to calculate a spot image obtained by deconvoluting the second image with the first image from the first image and the second image, and measuring the aberrations from the spot image.

7. The charged particle beam apparatus according to claim 1,
wherein marks for extraction of the periodic information on the annular ring are put into an arrangement that includes an n-th period component on the annular ring for an n-th order aberration measurement, n being an integer and n>1.

8. The charged particle beam apparatus according to claim 7,
wherein the marks for extraction of the phase information on the annular ring are marks such that at least one period among n periods is different from the others.

9. The charged particle beam apparatus according to claim 1,
wherein the opening groups on the annular ring include opening groups placed on concentric circles centered on at least two or more optical-axes and having different distances from the axes, and
wherein the marks for extraction of the phase information are placed at different periods, respectively.

10. The charged particle beam apparatus according to claim 1,
wherein the opening groups on the annular ring include opening groups placed on concentric circles centered on at least two or more optical-axes whose distances from the axes are different and having different distances from the axes, and
wherein the marks for extraction of the phase information are placed at different phases, respectively.

11. The charged particle beam apparatus according to claim 2,
wherein the first aperture part and the second aperture part are placed at different places in a circumferential direction centered on the optical-axis on the aperture plate, and
wherein the aperture for aberration measurement has a rotating mechanism provided on the aperture plate, and is configured to switch the first aperture or the second aperture to be on the optical-axis by rotating the aperture plate.

12. A charged particle beam apparatus, comprising:
a specimen stage on which a specimen is mounted;
an irradiation optical system for scanning a primary charged particle beam on the specimen mounted on the specimen stage;
a detector for detecting secondary charged particles generated by the scanning of the charged particle beam; and
an arithmetic unit for detecting aberrations;
wherein the irradiation optical system comprises:
an aberration corrector for correcting the aberrations of the primary charged particle beam emitted from the charged particle beam source; and an aperture for aberration measurement placed between the charged particle beam source and the aberration corrector, wherein the aperture for aberration measurement comprises:

a first aperture part equipped with a central opening placed on an optical-axis of primary charged particles emitted from the charged particle beam source; and a second aperture part having openings such that at least one opening is placed on each of a plurality of annular shaped concentric circles on the outside of the central opening centered on the optical-axis, wherein the arithmetic unit is configured to:

acquire a first image acquired by the charged particle beam having passed only the opening of the first aperture part and a second image acquired in the same scanning region as that of the first image by the charged particle beam having passed through the openings on the plurality of concentric circles with different radii of the second aperture part; and calculate a spot image obtained by deconvoluting the second image with the first image and measuring the aberrations from the spot image, wherein the second aperture has a plurality of groups of openings that are placed in an annular ring shape along the concentric circles centered on the optical-axis, and a cut or nontransparent region that serves as a mark provided at a specific phase on the annular ring for extraction of phase information.

13. The charged particle beam apparatus according to claim 12, wherein the irradiation optical system has a first lens for controlling an aperture angle, a second lens placed at a later stage of the first lens and for adjusting the passing primary charge particle beam to be at a specified angle, and the aberration corrector placed at the later stage of the second lens for correcting aberrations of the emitted primary charged particle beam, wherein the aperture for aberration measurement is placed between the first lens and the second lens or between the second lens and the aberration corrector, the aperture being equipped with the first aperture part placed on the optical-axis and the second aperture part having a plurality of openings placed concentrically centered on the first aperture part, wherein the arithmetic unit is configured to:

calculate the deconvoluted spot image from the first image acquired by the charged particle beam having passed through only the first aperture part by adjusting the first lens and the second lens, and the second image acquired by the charged particle beam having passed through the first aperture part and the second aperture part by adjusting the first lens and the second lens without changing the first lens and a scanning region, and measure the aberrations from the spot image.

14. The charged particle beam apparatus according to claim 13, wherein the second aperture is equipped with a plurality of openings that correspond to three different distances from the optical-axis on one sheet of aperture plate, and a rotating mechanism for rotating the aperture plate, wherein images of arbitrary phases are acquired by rotating the aperture plate and are designated as the first image and the second image.

15. The charged particle beam apparatus according to claim 13, wherein the plurality of openings placed on the concentric circles are put into an arrangement that includes an n-period component on the concentric circles for an n-th order aberration measurement, n being an integer and n>1.

16. The charged particle beam apparatus according to claim 15, wherein the opening groups are placed on the concentric circles centered on at least two or more optical-axes, have sizes and shapes that are different among the opening groups for enabling each opening group to be discriminated, and are placed with periods or phases different for each opening group.

17. A geometrical aberration measurement method of a charged particle optical apparatus, wherein the charged particle optical apparatus comprises:

a specimen stage on which a specimen is mounted;

an irradiation optical system for scanning a primary charged particle beam on the specimen mounted on the specimen stage;

a detector for detecting secondary charged particles generated by the scanning of the charged particle beam;

display means for displaying an output signal of the detector; and an arithmetic unit for detecting aberrations;

wherein the irradiation optical system has an aberration corrector for correcting aberrations of the primary charged particle beam emitted from a charged particle beam source and an aperture for aberration measurement placed between the charged particle beam source and the aberration corrector, wherein the aperture for aberration measurement has a first aperture part equipped with a central opening placed on an optical-axis of the primary charged particle beam emitted from the charged particle beam source, and a second aperture part having a plurality of openings that are placed on a plurality of concentric circles, each with different radii in an annular shape, respectively, on the outside of the central opening and each centered on the optical-axis, wherein the second aperture has a plurality of groups of openings that are placed in an annular ring shape along the concentric circles centered on the optical-axis, and a cut or nontransparent region that serves as a mark provided at a specific phase on the annular ring for extraction of phase information and the geometrical aberration measurement method comprises the steps of:

acquiring a first image by the charged particle beam having passed through the first aperture;

acquiring a second image by the charged particle beam having passed through the second aperture without changing a scanning region from that of the first image;

calculating a spot image obtained by deconvoluting the second image with the first image; and measuring aberrations from the spot image.

18. The geometrical aberration measurement method of the charged particle beam apparatus according to claim 17, wherein the aperture of aberration measurement is such that the first aperture part and the second aperture are placed on different places on the same aperture plate, wherein the first image is acquired by moving the first aperture part onto the optical-axis, and wherein the second image is acquired by moving the second aperture part onto the optical-axis.

19. The geometrical aberration measurement method of a charged particle beam apparatus according to claim 17,
   wherein the aperture for aberration measurement comprises: the first aperture part and the second aperture part which are placed concentrically centered on the optical-axis,
   wherein the first image is acquired by specifying the irradiation region of primary charged particles to be a region including only the first aperture part, and
   wherein the second image is acquired by switching the irradiation region of the primary charged particles to a region including the first aperture part and the whole of the second aperture part.

* * * * *